(12) United States Patent
Keenan et al.

(10) Patent No.: US 6,675,106 B1
(45) Date of Patent: *Jan. 6, 2004

(54) METHOD OF MULTIVARIATE SPECTRAL ANALYSIS

(75) Inventors: Michael R. Keenan, Albuquerque, NM (US); Paul G. Kotula, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 227 days.

This patent is subject to a terminal disclaimer.

(21) Appl. No.: 09/873,078

(22) Filed: Jun. 1, 2001

(51) Int. Cl.[7] ........................... G06F 19/00; G06F 17/16
(52) U.S. Cl. .......................... 702/28; 702/194; 702/196
(58) Field of Search ........................... 702/27, 28, 189, 702/194, 196, 197; G06F 19/00, 17/16

(56) References Cited

U.S. PATENT DOCUMENTS

| | | | |
|---|---|---|---|
| 4,660,151 A | 4/1987 | Chipman et al. | 364/498 |
| 5,357,110 A | 10/1994 | Statham | 250/307 |
| 5,379,352 A | 1/1995 | Sirat et al. | 382/41 |
| 5,583,951 A | 12/1996 | Sirat et al. | 382/232 |
| 5,596,195 A | 1/1997 | Obori et al. | 250/310 |
| 5,610,836 A | 3/1997 | Alsmeyer et al. | 364/498 |
| 5,701,074 A | * 12/1997 | Zhu | 324/307 |
| 5,866,903 A | 2/1999 | Morita et al. | 250/310 |
| 5,982,486 A | * 11/1999 | Wang | 356/346 |

OTHER PUBLICATIONS

Co-pending US patent application claims "*Apparatus and System for Multivariate Spectral Analysis*", M. R. Keenan, et al, commonly assigned to Sandia Corporation, Albuquerque, New Mexico.

B. Cross, "*Scanning X–Ray Fluorescence Microscopy and Principal Component Analysis*", Proc. 50th Annual Meeting of the Electron Microscopy Society of American Held jointly with the 27th Annual Meeting of the Microbeam Analysis Society and the 19th Annual Meeting of the Microscopical Society of Canada/Societe de microscopie du Canada(1992) pp. 1752–1753.

D. M. Hawkins and D. J. Olive, "*Improved feasible solution algorithms for high breakdown estimation*", Elsevier Computational Statistics & Data Analysis 30 (1999) pp. 1–11.

P. G. Kotula and M. R. Keenan, "*Automated unbiased information extraction of STEM–EDS spectrum images,*" Paper presented at 2nd Conf. Int. Union Microbeam Analysis societies, Kailua–Kona. Hawaii, Jul. 9–13, 2000 pp. 147–148.

P. G. Kotula and M. R. Keenan, "*Information Extraction: Statistical Analysis to get the most from Spectrum Images*" Microsc. Microanal. 6 (Suppl 2: Proceedings). Aug. 2000, pp. 1052–1053.

(List continued on next page.)

Primary Examiner—Stephen D. Meier
Assistant Examiner—Blaise Mouttet
(74) Attorney, Agent, or Firm—Robert D. Watson

(57) ABSTRACT

A method of determining the properties of a sample from measured spectral data collected from the sample by performing a multivariate spectral analysis. The method can include: generating a two-dimensional matrix A containing measured spectral data; providing a weighted spectral data matrix D by performing a weighting operation on matrix A; factoring D into the product of two matrices, C and $S^T$, by performing a constrained alternating least-squares analysis of $D=CS^T$, where C is a concentration intensity matrix and S is a spectral shapes matrix; unweighting C and S by applying the inverse of the weighting used previously; and determining the properties of the sample by inspecting C and S. This method can be used to analyze X-ray spectral data generated by operating a Scanning Electron Microscope (SEM) with an attached Energy Dispersive Spectrometer (EDS).

106 Claims, 21 Drawing Sheets

OTHER PUBLICATIONS

Rasmus Bro and Sijmen de Jong, "*A Fast Non–Negativity–Constrained Least Squares Algorithm,*" Journal of Chemometrics, vol. II (1997), pp. 393–401.

Jeremy J. Andrew and Thomas M. Hancewicz, "*Rapid Analysis of Raman Image Data Using Two–Way Multivariate Curve Resolution,*" Applied Spectroscopy. Vol 52, No. 6 (1998) pp. 797–807.

M. Schuenemann, V. Grosser, R. Leutenbauer, G. Bauer, W. Schaefer, H. Reichl, "*A highly flexible design and production framework for modularized microelectromechanical systems,*" Sensors and Actuators 73 (1999) pp. 153–168.

Pierre Trebbia and Noel Bonnet, "*EELS elemental mapping with unconventional methods I Theoretical basis: image analysis with multivariate statistics and entropy concepts*" Ultramicroscopy vol. 34 (1990) pp. 165–178.

B.G.M. Vandeginste, D. L. Massart, L.M.C. Buydens, S. de Jong. P. J. Lewi, J. Smeyers–Verbeke, "*Handbook of Chemometrics and Qualimetrics: Part B*" Data Handling in Science and Technology, Vol 20B, pp 142–144.

B.G.M. Vandeginste, D. L. Massart, L.M.C. Buydens, S. de Jong. P. J. Lewi, J. Smeyers–Verbeke, "*Handbook of Chemometrics and Qualimetrics: Part B*" Data Handling in Science and Technology, Vol 20B, pp 254–256.

H. H. Harman, "*Modern Factor Analysis*"*Third Edition* The University of Chicago Press, (1976) pp. 290–292.

M. R. Keenan, "*Multivariate Image Analysis Tools for Chemical Characterization*", Albuquerque High Performance Computing Center, Aug. (1999) pp. 1–53.

* cited by examiner

Principal components analysis

Singular Value Decomposition $$D = C \times S^T = \left( U \times \begin{matrix} & & 0 \\ & & \\ 0 & & \end{matrix} \right) \times V^T$$

"Scores"   "Loadings"

FIG. 12

METHOD OF MULTIVARIATE SPECTRAL ANALYSIS

FEDERALLY SPONSORED RESEARCH

The United States Government has rights in this invention pursuant to Department of Energy Contract No. DE-AC04-94AL85000 with Sandia Corporation.

COMPUTER PROGRAM LISTING

A computer program listing appendix has been submitted on two, identical compact discs in computer readable form, labeled "Copy 1" and "Copy 2", which is a duplicate of "Copy 1" disc. The material contained in this computer program listing appendix is herein incorporated by reference.

As a demonstration of a working implementation of the complete multivariate data analysis method, according to an embodiment of the present invention, the following software executable routines were implemented in MATLAB® language, MathWorks, Inc., Natick, Mass., and stored on a computer readable medium. Intel Math Kernel Library (MKL) and LAPACK routines (www.netlib.org) were incorporated as "mex-files". The source code, which is supplied as a Computer Program Listing Appendix on Compact Disk, and herein is incorporated by reference, includes the following files listed in Table 1.

TABLE 1

Files Contained on Computer Program Listing Appendix

| Name | Size | Date Created |
| --- | --- | --- |
| axsia.m | 5,230 | Aug. 8, 2000 |
| mk_als.m | 2,714 | Aug. 6, 2000 |
| mk_autoplotsandl.m | 1,800 | Aug. 7, 2000 |
| mk_base.m | 1,595 | Aug. 6, 2000 |
| mk_cxpeig.f | 2,894 | Jul. 15, 2000 |
| mk_gemm.f | 2,989 | Dec. 21, 2000 |
| mk_ger.f | 2,375 | Dec. 21, 2000 |
| mk_nnls.m | 3,693 | Aug. 6, 2000 |
| mk_npures.m | 701 | Aug. 6, 2000 |
| mk_outputfiles.m | 1,405 | Aug. 14, 2000 |
| mk_readnoran.m | 941 | Aug. 7, 2000 |
| mk_varimax.m | 1,694 | Aug. 6, 2000 |

FIELD OF THE INVENTION

The present invention relates generally to the field of chemical compositional analysis, and more specifically to a method and apparatus for performing multivariate spectral analysis.

BACKGROUND OF THE INVENTION

In general, multivariate spectral analysis for chemical microanalytical characterization of a sample can include: (1) determining the number of chemical species (pure elements and chemical phases or alloys) that comprise the inhomogeneous mixture being imaged; (2) extracting the spectra of these "pure" components (elements or phases); (3) quantifying the amount or concentration of each component present in the sample; and (4) mapping the spatial distribution of these components across the sample, while simultaneously preserving a high spatial resolution. Full spectrum images refer to a complete spectrum that is produced at each pixel of 2-D array of pixels (i.e., image).

Spectral data can be produced by a variety of microanalytical techniques, including: Electron Probe Microanalysis (EPMA), also called X-Ray Microanalysis (XMA) in Japan, Scanning Electron Microscopy (SEM) with attached Energy Dispersive Spectrometer (EDS), X-ray fluorescence (XRF), Electron Energy Loss spectroscopy (EELS), Particle Induced X-ray Emission (PIXE), Auger Electron Spectroscopy (AES), gamma-ray spectroscopy, Secondary Ion Mass Spectroscopy (SIMS), X-Ray Photoelectron Spectroscopy (XPS), Raman Spectroscopy, Magnetic Resonance Imaging (MRI) scans, Computerized Axial Tomography (CAT) scans, IR reflectometry, etc.

The spectral data can be generated from a spot on the sample, from a 1-D line scan, or from a 2-D rastered pattern. Other dimensions, however, can be time or temperature, for example. Hence, the spectral data can vary with time, for example, as a chemical reaction process evolves over time, or from species diffusing across an interface, or concentrations that vary with temperature as the sample heats up.

A spectrum is created by detecting radiation (e.g., photons or particles) emitted within a specified interval (window) of energy (mass, wavelength, or frequency), as a function of energy (mass, wavelength, or frequency). In other words, we measure the energy (or mass, wavelength, or frequency) of emitted photons (or particles) and then "bin" them according to their energy (mass, wavelength, or frequency). The spectrum is basically a histogram that results from this binning process. The spectrum generally includes well-defined spectral features that have a characteristic energy distribution (mass, wavelength, or frequency).

We define "spectral features" to include sharp, well-defined spectral peaks, as well as double-peaks, overlapping peaks, and less well-defined maxima.

The phrase "energy spectrum" is broadly defined to also include a "mass spectrum" (for mass spectroscopy), a "wavelength spectrum" (for wavelength dispersive analysis, WDS), a "frequency spectrum" (for Fast Fourier Transform analysis), or an "acoustic spectrum" (for sound/speech analysis).

The word "characteristic" broadly relates to a property that is typical or characteristic of a material's unique individual atomic or molecular structure. For example, in X-ray spectroscopy, "characteristic" refers to a specific electronic transition in the element's atomic structure resulting in emission of an X-ray having a well-known energy. However, in infrared spectroscopy, the characteristic property relates to vibrational transitions; and in mass spectroscopy, to the mass of fragments. Additionally, the spectrum can includes contributions from non-"characteristic" sources (e.g., continuum radiation from background or Bremsstrahlung X-radiation), which are continuous and don't have characteristic peaks or lines. Inspection of the detected spectrum allows the chemical composition to be determined by comparison of the spectral peaks with spectra measured from known elements or phases, which can found in lookup tables in data libraries, books, etc.

In electron probe microanalysis (EPMA), for example, a pre-selected small area on the surface of a solid specimen is bombarded with energetic electrons (e.g., 20 KeV electrons). The resulting emission from the sample includes a variety of particles and photons, including: backscattered primary electrons, low-energy photoelectrons, Auger electrons, and characteristic X-ray emission superimposed on a background of continuum (i.e., Bremsstrahlung) X-radiation. The X-rays emitted by the sample are counted and recorded by an X-ray detector, a crystal spectrometer, or an Energy Dispersive Spectrometer (EDS). A multi-channel EDS spectrum analyzer (e.g., with 1024 "energy" channels)

is used to count the number of X-rays randomly emitted during the counting period within a single channel (i.e., a small band of energy having a width, $\Delta E$. For example, $\Delta E$ can be equal to 10 eV. A 2-D "full spectrum" image is generated by scanning and rastering a focused electron beam spot across the surface of a sample, at a specified spatial resolution (e.g., 128×128 pixels). For each pixel, a multi-channel (e.g., 1024) X-ray spectrum is detected by the EDS. A full spectrum image contains, for example, a 3-D array of 128×128×1024=16.8 million data points. The measured X-ray spectrum from a single pixel can have spectral contributions integrated from not only multiple elements, but also multiple phases.

The word "sample" is not limited to representing a small, conventional specimen that would be used, for example, in a Scanning Electron Microscope. "Sample" is broadly defined to mean any surface area or volume of a material that is emitting radiation that can be detected by a detector. For example, the word "sample" can include the Earth's (or Moon's) surface, which may be emitting radiation (in response to irradiation by Sunlight) that can be detected by an array of CCD detectors located on a satellite in orbit around the Earth (or Moon). The "sample" can also include astronomical objects, such as stars and galaxies, which emit radiation detected by telescopes.

The phrase "radiation emitted by the sample" is broadly defined to include any type of photon or particle, including, but not limited to: radio waves, microwaves, visible light, infrared radiation, ultraviolet radiation, X-rays, gamma-rays, electrons, positrons, protons, neutrons, neutral particles, alpha particles, charged particles (ions), ionized atoms, ionized molecules, excited molecules. We also include in this broad definition of "radiation emitted by the sample" the emission of acoustic energy (i.e., sound waves). We also include in this broad definition of "radiation emitted by the sample" the transmission of radiation through a sample, either completely or partially, which is subsequently "emitted" from the far side of the sample. Emission is defined to include the scattering or reflection of particles from a surface. Particles may be "emitted" from a sample by sputtering processes (as in SIMS).

Emission of radiation from the sample can result from stimulation of the sample by an external source, or from naturally radioactive elements (isotopes) contained within. Emitted "radioactive" particles can include beta (electrons), gammas (high-energy photons), alpha particles (helium ions), neutrons, and other particles. Emitted radioactive particles can interact with the surrounding material in the sample and induce or stimulate other forms of radiation to be emitted in response to the flux of radioactive particles.

The phase "simulating a sample to emit radiation" is defined as applying an external stimulus that can include exposing (irradiating) the sample to: radio waves, microwaves, visible light, infrared radiation, ultraviolet radiation, X-rays, gamma-rays, electrons, positrons, protons, neutrons, neutral particles, alpha particles, or charged particles (ions). Additionally, applying an external stimulus can include passing an electric current through the sample, inducing ultrasonic vibrations, or mechanically stressing the sample (e.g., pulling or bending the sample to create acoustic emission). Application of the external radiation can include irradiation by a single probe beam, or parallel irradiation by a plurality of multiple, parallel beams.

Against this background, the present invention was developed.

BRIEF DESCRIPTION OF THE DRAWINGS

The accompanying drawings, which are incorporated in and form part of the specification, illustrate various examples of the present invention and, together with the detailed description, serve to explain the principles of the invention.

FIG. 12 illustrates the schematic relationship between PCA and SVD, according to an embodiment of the present invention.

DETAILED DESCRIPTION OF THE INVENTION

Figure 1:
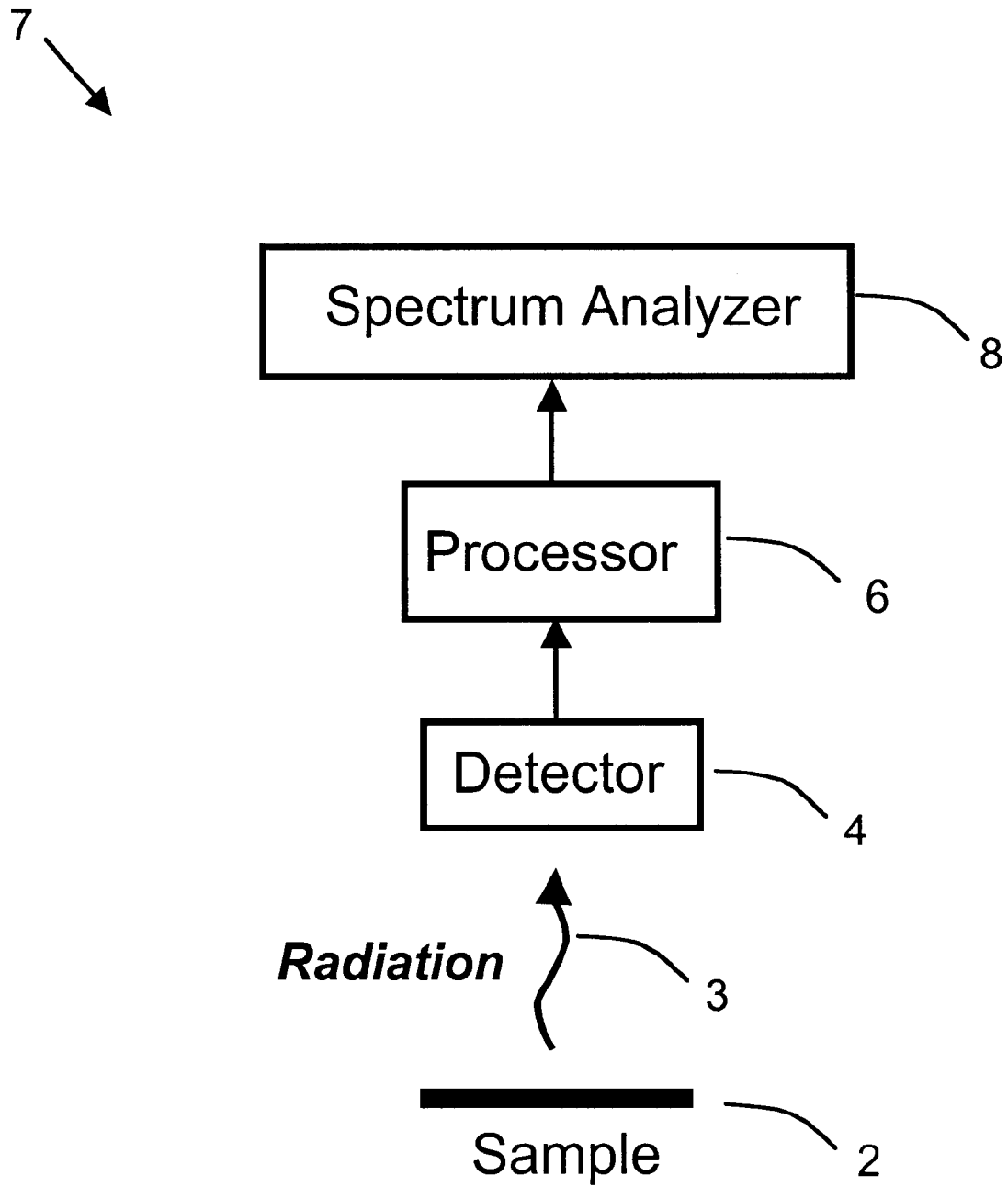
FIG. 1 illustrates a multivariate spectral analysis system, according to an embodiment of the present invention.

FIG. 1 illustrates a multivariate spectral analysis system 7 for determining the properties of a sample from measured spectral data, according to an embodiment of the present invention. Radiation 3 emitted from sample 2 is detected by detector 4. Processor 6, which is operatively connected to detector 4, processes the detected radiation and generates measured spectral data representing the "energy" spectrum (as it is broadly defined) of the detected radiation. Spectrum analyzer 8, which is operatively connected to processor 6, performs a multivariate spectral analysis of the measured spectral data provided by processor 6, whereby the properties of the sample are determined.

Figure 2:
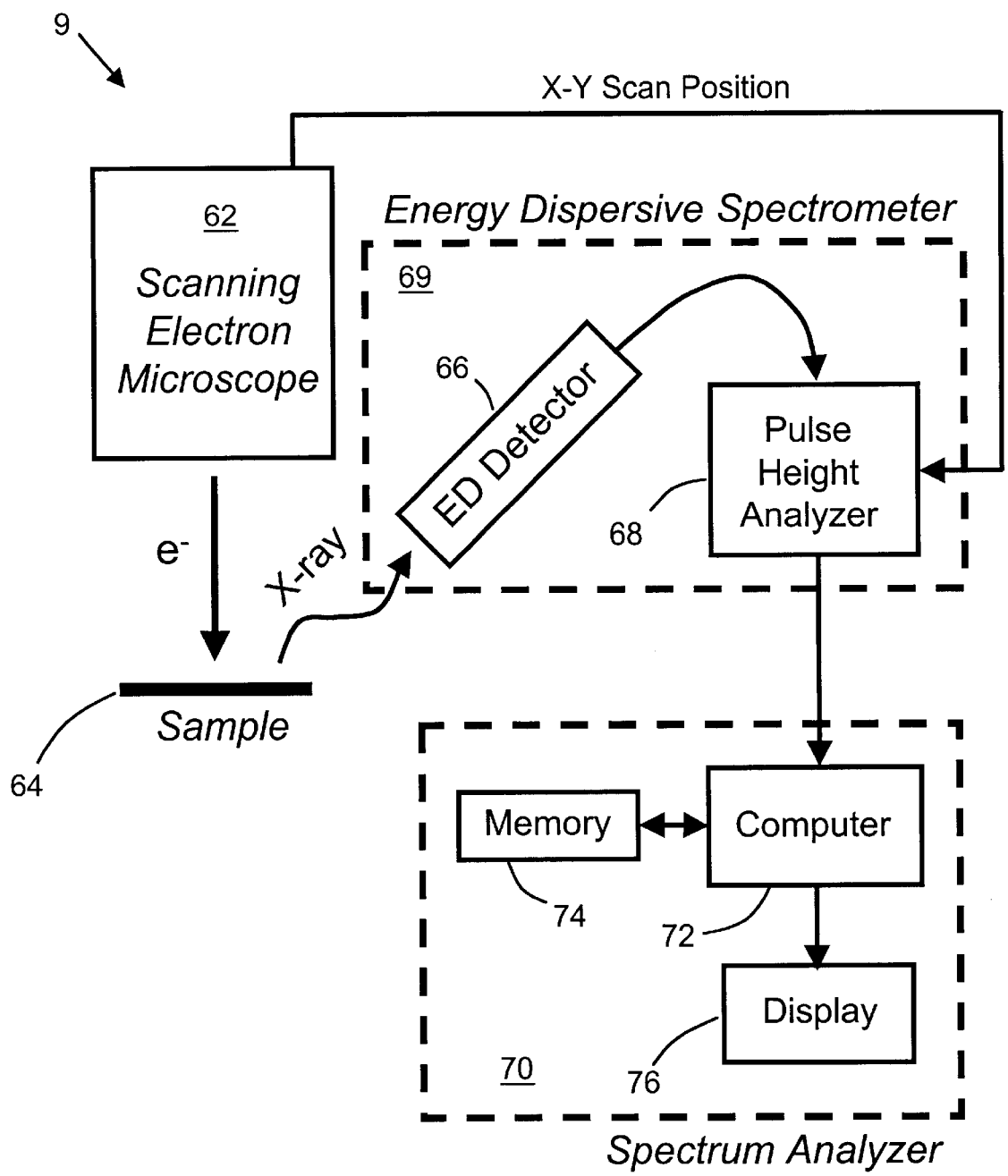
FIG. 2 illustrates a multivariate spectral analysis system comprising a scanning electron beam microscope with Energy Dispersive Spectrometer and Spectrum Analyzer according to an embodiment of the present invention.

FIG. 2 illustrates a multivariate spectral analysis system 9 comprising scanning electron beam microscope 62 with Energy Dispersive Spectrometer 69 and Spectrum Analyzer 70, according to an embodiment of the present invention. Electron gun 62 directs a focused beam of energetic electrons (e.g., 5–30 KeV) towards the surface of a sample 64. The e-beam spot can be focused at a stationary spot, scanned across the sample in a 1-D line pattern, or scanned in a 2-D rastered pattern. Interaction of the energetic electrons with the sample stimulates random emission of X-rays. The emitted X-rays are detected by Energy Dispersive (ED) detector 66, which generates a pulse signal having a pulse-amplitude (e.g., pulse-height) proportional to the energy of the detected X-ray. ED detector 66 can be, for example, an intrinsic Ge or Si(Li) solid-state detector (Ge can be purified sufficiently so that it is intrinsic, whereas Si cannot; so, Li is drifted in Si to give the appropriate electrical properties). Alternatively, ED detector 66 can be an array of charge coupled devices (CCD), capable of providing parallel detection (i.e., simultaneous detection from an 2-D array of CCD detectors). Output from detector 66 goes to a pre-amplifier and a main amplifier (not shown), then to a Pulse Height Analyzer 68, which counts and sorts the total number of X-rays detected by detector 66 during a specified period of time (i.e., the counting time), at a selected energy (e.g., 4 KeV), with an energy resolution of about 130 eV dispersion, and a channel width (energy window) of 10–20 eV per channel. A multi-channel Pulse Height Analyzer 68 typically has on the order of 1000–2000 energy channels (e.g., 1024–2048 channels), covering the range of energies from 0 to 20 KeV. The X and Y-coordinate data for the position of the e-beam spot is also provided from SEM 62 to pulse height analyzer 68. The combination of ED detector 66 and Pulse Height Analyzer 68 is conventionally called an Energy Dispersive Spectrometer (EDS) 69.

The raw (i.e., measured) data output by EDS 69 (in the form of electrical signals representing X-ray counts or counts per second/minute) is generally digitized and sorted into "bins", where each bin generally contains four parameters: (1) energy channel number (i.e., X-ray energy), (2) X-coordinate of the pixel, (3) Y-coordinate of the pixel, and (4) total number of counts. EDS 69 can organize and store the measured data in digital memory in a variety of 2-D or 3-D formats, for example: by channel number, by pixels row-wise, by pixels column-wise, or by other types of channel interleaving.

Figure 3:
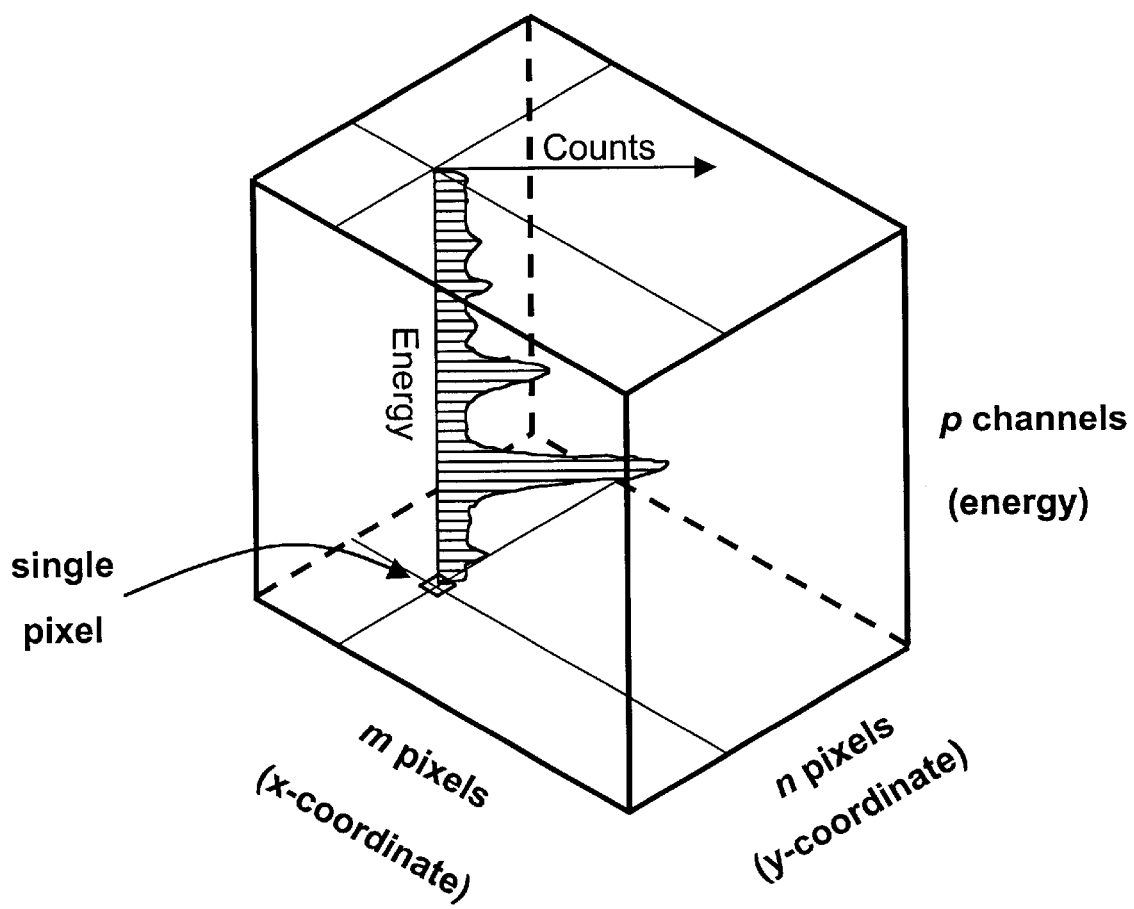
FIG. 3 illustrates a three-dimensional data array, according to an embodiment of the present invention.

FIG. 3 illustrates the structure of a 3-D data array "cube". After counting has been completed, the measured data can be organized as a 1-D spectrum at each point (pixel) on a 2-D spatial grid corresponding to the (X,Y) coordinates of the pixel's location. This 3-D data array "cube" has been described as "Position-Tagged Spectrometry (PTS)" by Princeton Gamma-Tech, Inc. of Princeton, N.J. Alternatively, in the present invention, we simply name this 3-D data array as X. Later on, we will reorganize the 3-D array X into a 2-D data matrix A to permit the easy and efficient use of standard linear algebra and matrix operations.

The measured spectral data output by spectrometer 69 is transmitted to Spectrum Analyzer 70. This can be accomplished through a direct link between spectrometer 69 and spectrum analyzer 70 (e.g., via electrical or optical cable), or by wireless means, for "real-time" spectral analysis. Alternatively, the measured spectral data can be stored on computer readable memory means (e.g., CD-ROM, DVD, magnetic tape, etc.) and provided to spectrum analyzer 70 at a later time for off-line post-processing. Spectrum Analyzer 70 can comprise computer processor 72; operator interface means (such as a keyboard or computer mouse; memory means 74 for storing data and executable instructions; interface means for data input and output, executable software instructions embodied in executable computer program code; and display means 76 for displaying the results of a multivariate spectral analysis, which enable the chemical composition and spatial distribution of elements and phases of sample 64 to be determined. Computer processor 72 can be a standard laboratory Personal Computer (PC), for example, using an Intel Pentium III microprocessor, such as made by IBM, Compaq, Dell, etc; or a workstation, such as made by SUN, HP, Silicon Graphics, etc, running UNIX or Linux operating systems. Alternatively, processor 72 can be a Dell Precision 410 PC with dual Pentium III processors running at 500 MHz, 1 GB of RAM, and 18 GB of hard disk memory, running Windows 95 or greater operating system. Alternatively, processor 72 can be a Dell Precision 620, running dual Pentium III processors at 933 MHz. Alternatively, processor 72 can comprise sixteen parallel processor nodes on an IBM SP2 machine.

Software instructions can be expressed in any of a variety of well-known computer languages, including MATLAB®, FORTRAN, C, C++, and Java.

Working embodiments of the present invention have used the software package MATLAB®, Ver. 5.3 (available from MathWorks, Inc., Natick, Mass.) to implement the main program, subroutines, subprograms, and input/output routines. However, other high-level application programming interfaces can be used for the same purpose (e.g., MAPLE, Mathematica, or Octave).

In working embodiments of the present invention, we have written Fortran code (the files with the .f extension) which makes calls to MATLAB®-supplied routines, as well as to Intel Math Kernel Libraries. This is compiled into a Windows dynamic link library (.dll file), which is a binary executable file. To be precise, the .dll is the mex-file. The corresponding .m file links into the MATLAB® help system to provide on-line help regarding the function calling syntax.

The present invention can use a hierarchy of linear algebra subroutines and subprograms that are publicly available from a variety of sources. At the most basic level are the BLAS routines, which stands for Basic Linear Algebra Subprograms. These include, for example, basic vector and matrix multiplication routines. At the next level is LAPACK, which stands for Linear Algebra PACKage. LAPACK provides routines for solving systems of simultaneous linear equations, least-squares solutions of linear systems of equations, eigenvalue problems, and singular value problems. The associated matrix factorizations (e.g., LU, Cholesky, QR, SVD, Schur, generalized Schur) are also provided. LAPACK handles dense and banded matrices, but not general sparse matrices. However, other libraries are available that handle sparse matrices. In all areas, similar functionality is provided for real and complex matrices, in both single and double precision. LAPACK routines make calls to BLAS routines. Source codes for the BLAS and LAPACK routines are freely available at www.netlib.org via anonymous ftp and the World Wide Web. Details of LAPACK and BLAS routines can be found in, *LAPACK User's Guide*, Third Edition, by E. Anderson et al., Society for Industrial and Applied Mathematics, Philadelphia, Pa., ISBN (0-898710447-8) 1999, which is herein incorporated by reference.

Highly efficient and optimized machine-specific (i.e., processor-specific) implementations of BLAS and LAPACK libraries are available for a variety of modern high-performance computer architectures. For example, Intel provides and supports their own Math Kernel Library (MKL), which includes Intel Pentium® and Intel Itanium® processor-optimized implementations of the BLAS and LAPACK routines. Other vendors, e.g. Compaq, HP, IBM, SGI, and SUN, also provide their own versions of processor-optimized BLAS and LAPACK routines. However, this is not the only way to obtain optimized math libraries. For example, there is software called ATLAS for "Automatically Tuned Linear Algebra Software", also freely available at www.netlib.org, that automatically generates machine (i.e., processor) optimized versions of a BLAS or LAPACK routine on platforms other than a Pentium processor (e.g., AMD Athalon processors). There are also commercial products such as the CXML library that is included with the Compaq Visual Fortran compiler and the Numerical Algorithms Group (NAG) libraries.

In working embodiments of the present invention, we used BLAS and LAPACK routines supplied by Intel's Math Kernel Library (MKL), since they are optimized to run on our Pentium-III processor computers.

Figure 4:
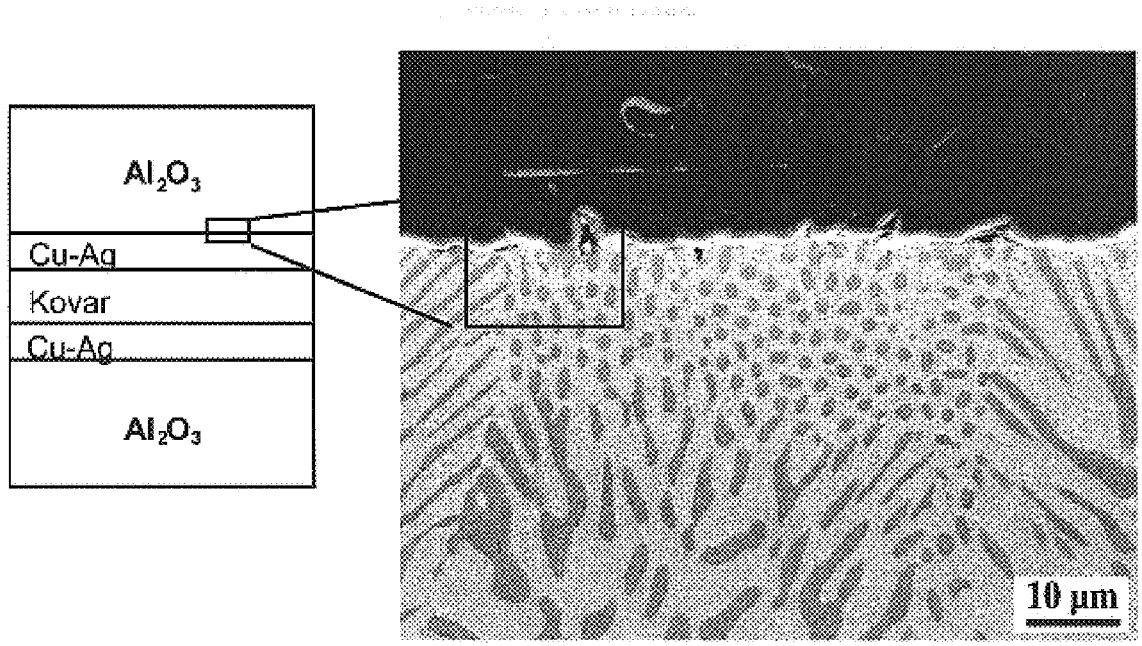
FIG. 4 illustrates an example of a backscattered electron image obtained in a scanning electron microscope at Oak Ridge National Laboratories.

FIG. 4 illustrates an example of a backscattered electron (BSE) image obtained in a scanning electron microscope at Oak Ridge National Laboratories. The sample consists of alumina ($Al_2O_3$) ceramic bonded with a copper-silver-titanium braze to both sides of a layer of KOVAR (an alloy of iron, nickel, and cobalt). A multivariate spectral image was collected by an attached EDS from the region shown by the rectangular inset box in FIG. 4 by rastering the electron beam such that a 1024 energy channel EDS spectrum was obtained at each point (pixel) on a 75×100 grid located within the rectangular inset box. The brightest pixels correspond to the highest average atomic number (Z) of the constituents in the microstructure.

Figure 5:
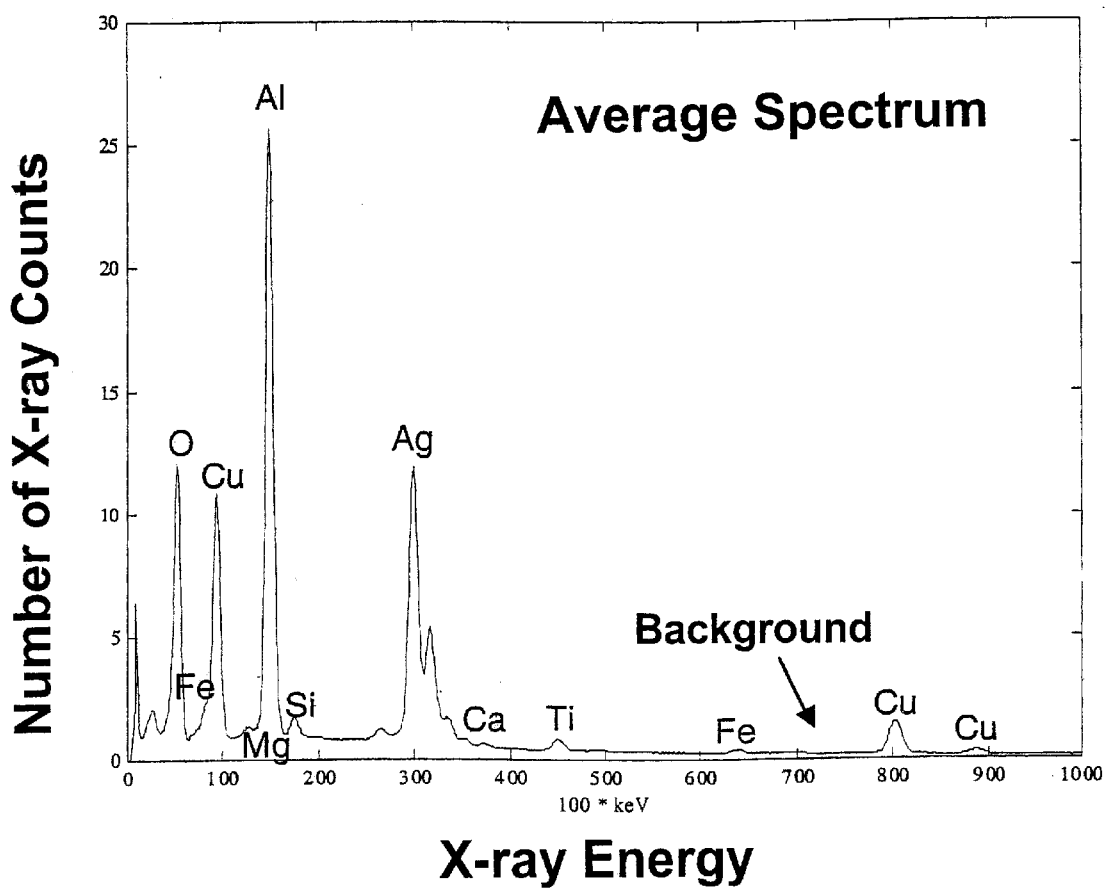
FIG. 5 illustrates a mean or average X-ray energy spectrum obtained by averaging over all of the individual spectra from each of the 75×100 pixels of the sample shown in FIG. 4

FIG. 5 illustrates an example of a mean or average X-ray energy spectrum obtained by averaging over all of the individual spectra from each of the 75×100 pixels for the sample shown in FIG. 4 (i.e., the average of all 7500 individual spectra). The average spectrum shown in FIG. 5 is similar to a spectrum that would be obtained in a traditional EDS measurement where the emitted X-rays are collected simultaneously from the entire area within the box, rather than from individual pixels. In FIG. 5, the X-ray energy is plotted along the horizontal axis, and the intensity of the measured signal (total number of counts within a specific energy channel) is plotted along the vertical axis. Each spectral peak has been pre-identified as a likely element.

Some elements (e.g., copper or iron) can have more than one significant spectral peak. Others (e.g., aluminum) only have a single, well-defined spectral peak. As expected in this example, aluminum, oxygen, copper, and silver are the predominant elemental constituents found in the vicinity of the brazed alumina interface. One thing that is lacking, however, is any indication that aluminum and oxygen are associated together as a chemical phase, as would be expected for the known composition of alumina (i.e., $Al_2O_3$). The compositional nature of the copper-silver braze also remains hidden. We cannot tell, for instance, whether the copper and silver are homogeneously mixed; whether they form separate phases; or are found in some intermediate state.

Several minor and trace elements are also evident in FIG. 5. Titanium is present, as are iron, nickel and cobalt (which are the main constituents of KOVAR). Finally, silicon, calcium and magnesium are observed (which are common glass-forming elements found in Alumina). As was the case with the major elemental components, the average spectrum shown in FIG. 5 yields no information about the chemical state of these minor species, namely, whether one or more elements are associated with one another. Multivariate spectral analysis can be used to address such questions. Additionally, the background of continuum (i.e., Bremsstrahlung) X-ray radiation can also be observed in FIG. 5 as the relatively flat line located in-between the spectral peaks.

In general, the observed EDS spectra are linearly additive to first order. In other words, the signal intensity due to a given element is linearly related to the amount or concentration of that particular element present in the sample, and does not depend at all on the amounts of any other elements present. Then, the overall observed spectrum is approximately the sum of the spectra of the individual pure elements, weighted by the amount of each present in the sample. It may happen, however, that two or more elements co-vary together. A good example, with reference to FIGS. 3 and 4, is alumina (i.e., aluminum and oxygen). Due to the fixed stoichiometry of alumina ($Al_2O_3$), one would expect that a variation in the aluminum X-ray emission intensity would be accompanied by a proportional variation in the oxygen X-ray intensity. In this sense, the two signals would co-vary. The pure spectral component, in this case, would be neither of the individual elements aluminum nor oxygen, but, rather, the particular stoichiometric combination of the two that has X-ray energies that are uniquely characteristic of the alumina phase. Consequently, when a given spectrum only has information about one single chemical phase in the sample, then that spectrum can be defined as describing a "pure" spectral component. Of course, any single element would also be considered a "pure" spectral component if it is not found to be systematically or statistically associated with any other elements in the sample.

Figure 6:
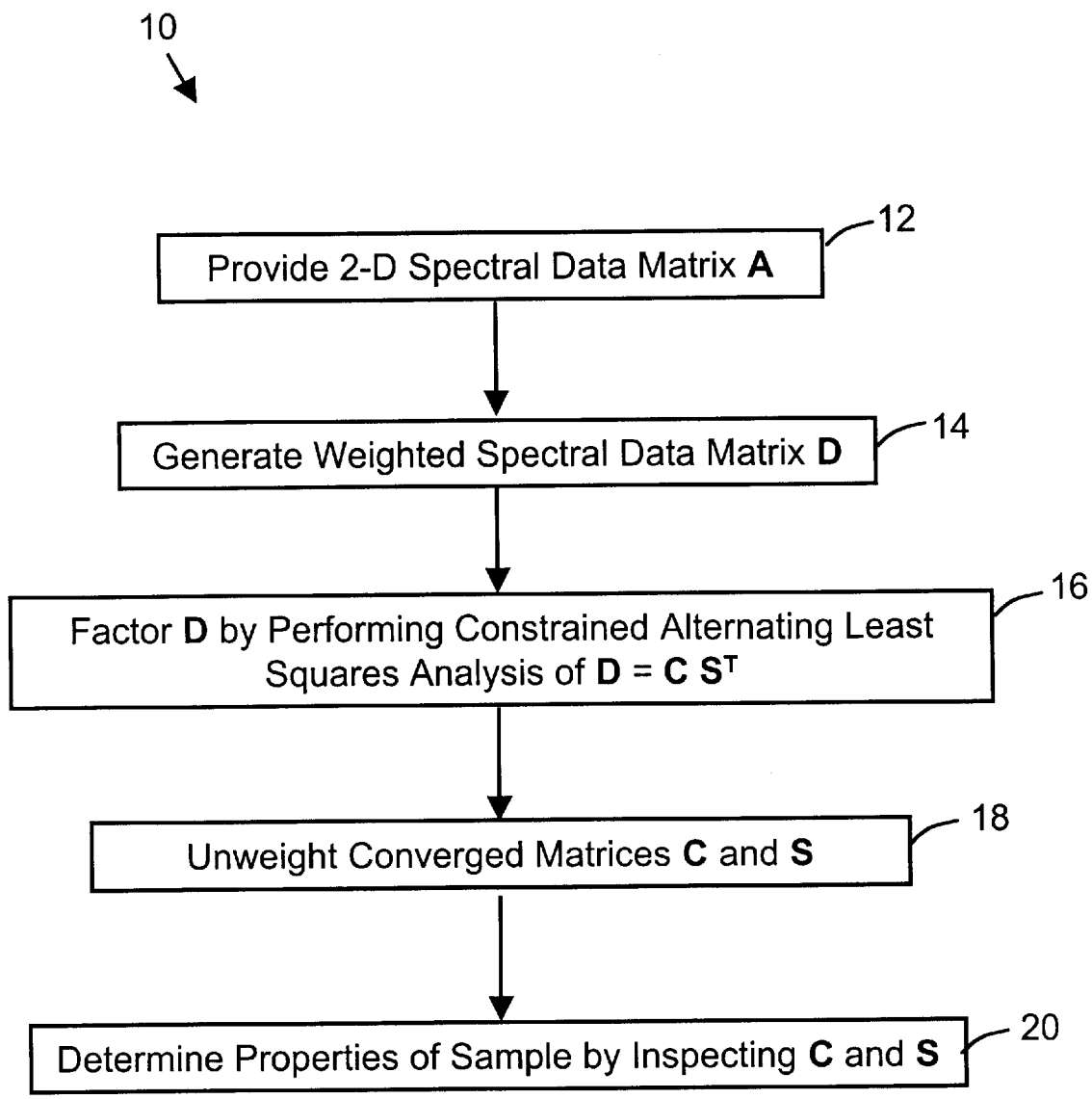
FIG. 6 illustrates a method for performing multivariate spectral analysis, according to an embodiment of the present invention.

Method According to FIG. 6

FIG. 6 illustrates a method of determining the properties of a sample from measured spectral data, according to an embodiment of the present invention. Method 10 comprises a series of sequential steps that can be executed by a computer. First, in step 12, a two-dimensional measured spectral data matrix A is provided. Next, in step 14, matrix A is weighted to generate a weighted spectral data matrix D. Matrix A can be weighted, for example, to account for heteroscedastic noise in the observations (e.g., counts), or for hot or dead pixels in a detector. Next, in step 16, the weighted spectral data matrix D is factored into the product of two matrices, C and $S^T$, according to:

$$D = CS^T \tag{1}$$

where D has dimensions of $N_{pixels} \times p$. The matrix C is a concentration intensity matrix, commonly known as the "scores" matrix, which is related to the concentration of the chemical phases and has dimensions of $N_{pixels} \times p$ (prior to compression). The matrix S is a spectral shapes matrix, commonly known as the "loadings" matrix, which contains information about the spectral shapes. S has dimensions $p \times p$ (prior to compression), and the columns of S are the principal components or eigenvectors V of the data crossproduct matrix $D^T D$.

This factorization can be accomplished by performing a constrained Alternating Least Squares (ALS) analysis of Eq. 1, sufficient to achieve an acceptable level of convergence of C and S. The constraint condition used in the constrained ALS procedure of step 16 can be a non-negativity constraint. Next, in step 18, the resultant converged matrices C and S from the ALS procedure are unweighted by applying the inverse of the weighting procedure that was used previously in step 14. Finally, in step 20, the properties of the sample are determined by inspecting the converged matrices C and S. Other methods for factoring the matrix D, such as eigen value decomposition (EVD) or singular value decomposition (SVD) will be discussed later.

Step 12 in FIG. 6: Provide Two-Dimensional Measured Spectral Data Matrix A Matrix A, containing measured spectral data, can be provided in a variety of different ways. It can be provided, in a variety of data formats, on a computer-readable media, such as a CD-ROM, CD-W, DVD, magneto-optical disk, or magnetic tape. This would allow post-processing of the spectral data at a later time (i.e., after the data has been measured).

As discussed previously, the measured spectral data can be provided directly to Spectrum Analyzer 70 by Energy Dispersive Spectrometer 69 (see FIG. 1), where it can be operated on directly by computer 72, or stored in memory means 74 for subsequent post-processing analysis.

Alternatively, data matrix A can be provided by unfolding a three-dimensional spectral data array X into a two-dimensional matrix of measured spectral data A.

Step 14 in FIG. 6: Generate Weighted Data Matrix D

The measured spectral data matrix A (e.g., total counts or counts/second) can be weighted, depending on the type of experiment being analyzed, and depending on the properties of the noise or background signal generated during data acquisition. Weighting is generally used whenever the properties of the noise are not uniform throughout the measurement space (i.e., heteroscedastic noise). This is particularly true in the case of "counting" experiments in which the noise is characterized as following a Poisson probability distribution that varies with the magnitude of the signal. For multi-channel data acquisition the noise is not characterized by a single probability distribution, but rather, by a distribution whose parameters will, in principle, differ from channel to channel. Additionally, heteroscedasticity can also arise from other effects, e.g., non-uniform detector responses, or mathematical transformations applied to the data (e.g., taking logarithms).

Weighting can be used when the signal being acquired is generated by individual events occurring randomly in time, as is the case for the emission of X-rays from a sample exposed to a beam of energetic electrons. The counting of these random emissions consequently obey Poisson statistics and fall on the well-known Poisson distribution. By "Poisson", we mean that the distribution (or histogram) of the number of measurements (i.e., frequency) of X-ray counts during a fixed time interval plotted versus the number of X-ray counts may be closely approximated by a distribution having a standard deviation equal to the square root of the mean value. Poisson statistics imply that the magnitude of the noise in a given energy channel is proportional to the magnitude of square root of the signal in that channel. The general solution, therefore, to this problem is to weight the measured data via matrix multiplication with the "inverse square root" of the noise covariance matrix. This weighting transformation has the useful effect of making the effect of noise uniform in the transformed space. Then, at the end of the analysis procedure, an inverse transform is performed to get back to the original unweighted space.

The step of weighting the measured data also applies, more broadly, for experiments where the detector's response varies with energy, or where the detector's noise varies with the size of the signal. For example, the response of an EDS detector may be non-linear at either very low, or very high, photon energies. Alternatively, unusually high count rates may create non-linear responses due to saturation and dead-time problems with the detector.

Weighting is useful when there is a large disparity between the total number of counts (e.g., observations) arising from different elements or phases (e.g., a sample comprising a small amount of contaminant located on top of a substrate made of a single material). Weighting, therefore, is useful for accurately identifying minor phases, trace elements, or subtle gradients in composition across a sample; by properly accounting for the smaller number of counts coming from these locations (i.e., relative to the comparatively large, well-defined spectral peaks). The weighting step can be performed before subtracting out any background or background signal, since the result after subtraction no longer obeys Poisson statistics.

Weighting can also be used to account for data "outliers". Data outliers can include malfunctioning energy channels or pixel elements in a detector array. For example, a dead (i.e., inoperative) energy channel (e.g., zero signal) can be effectively removed from the data matrix A by assigning a sufficiently small weight. Alternatively, for detectors that use a CCD pixel array, an occurrence of a "hot" (i.e., saturated) or dead pixel can be weighted in a similar fashion, namely, by assigning a sufficiently small weight.

Data matrix A can be weighted to create a weighted data matrix D according to Eq. 2:

$$D = GAH \tag{2}$$

where A has dimensions $N_{pixels} \times p$; G is a pre-multiply weighting matrix having dimensions $N_{pixels} \times N_{pixels}$; and H is a post-multiply weighting matrix having dimensions $p \times p$. In general, G is used to weight the row-space of A, and H is used to weight the column-space of A.

The matrix G can be used to account for unequal variance in the observations from pixel-to-pixel, independent of channel number (i.e., energy or wavelength). For example, weighting by G could be used in the case where there are hot or dead pixels, or if there was an array detector where different detector elements had different noise properties. Weighing by G also could be used in the situation where there were much higher total counts in some pixels as compared to others, caused, for example, by unequal dwell times.

The matrix H can account for unequal variance in the observations from channel-to-channel, independent of pixel location. For example, weighting by H could be used when the noise level varies from one energy channel to the next. For X-ray detection in spectral analysis, the noise will be higher on average in channels that have greater signal on average due to the Poisson nature of a counting experiment.

We have developed a number of different approaches for generating the weighting matrices G and H. In the first approach, weighting is based on Poisson statistics. In experiments governed by Poisson statistics, counting statistics dominate the noise, thus, the noise variance in an observation is proportional to the observation. Also, the variance of the variables is proportional to the magnitude of the variables. The diagonal elements of G can be set to be proportional to the inverse square root of the mean image (properly unfolded). The diagonal elements of H can be set to be proportional to the inverse square root of the mean spectrum.

However, we have found (after performing a series of numerical experiments) that the matrix G can be set equal to the identity matrix, I, without significantly reducing the accuracy of the final results. This can be explained by observing, in general, that the mean image (not shown) is fairly nondescript and devoid of significant contrast.

To obtain the mean spectrum vector of A we simply average the spectra obtained from each pixel over the entire 2-D image. For example, in a 128×128 pixel×1024 channel full spectrum image, we have 16,384 individual spectra. Therefore, the mean spectrum is a vector of length 1024, which represents the mean spectrum averaged over the 16,384 spectra. In other words, the mean spectrum vector of A is created by averaging the spectra obtained from each pixel over all of the pixels. To perform the weighting, we then construct the diagonal weighting matrix H (e.g., 1024× 1024) whose diagonal elements are set equal to the inverse square roots of the corresponding elements in the mean spectrum vector of A. We then post-multiply the original (16,384×1024) data matrix A by this weighting matrix H (according to Eq. 2).

In a more general situation where the noise may or may not follow Poisson statistics, or when the noise has non-uniform or correlated properties, other approaches for weighting the data matrix A can be used. A general approach to weighting is to multiply the data matrix A by the inverse square root of the noise covariance matrix. This approach can comprise applying a Maximum Noise Fraction (MNF) transform. The MNF transform assumes G=I (the identity matrix) and H=the "inverse square root" of an estimated noise covariance matrix. That is, if K represents an estimate of the noise covariance matrix, an eigen value decomposition (EVD) of K yields:

$$J^T K J = M \text{ or } K = J M J^T = (J M^{1/2})(M^{1/2} J^T) = (M^{1/2} J^T)^T (M^{1/2} J^T) \quad (3)$$

where J is an orthogonal matrix of eigenvectors, and M is a diagonal matrix containing eigenvalues. K is a symmetric positive definite matrix. Taking the inverse of K, and realizing that $J^{-1} = J^T$, yields:

$$K^{-1} = (M^{1/2} J^T)^{-1} (M^{1/2} J^T)^{-T} = (JM^{-1/2})(JM^{-1/2})^T = HH^T \quad (4)$$

Thus, by inspecting Eq. 4, we can write:

$$K^{-1} = HH^T \quad (5)$$

The weighting matrix $H = JM^{-1/2}$ is exactly the weighting matrix that is used in the MNF transform.

However, this particular factorization (i.e., MNF) is not unique. For example, performing a Cholesky factorization on $K^{-1}$ would also result in a square root matrix that differs from, and in many respects, would be superior to, the one computed by the MNF procedure.

In general, the estimated noise covariance matrix K can be generated according to Eq. 6:

$$K = N^T N / N_{pixels} \quad (6)$$

Where the elements of the matrix N are the standard deviation of each observation (here, observation is defined as the measurement of counts or counts/second in a single energy channel, at a single pixel). The matrix N has the same dimensions as the weighted data matrix D ($N_{pixels} \times p$), where the total number of pixels in the 2-D image, $N_{pixels}$, is given by the product m×n.

There are a number of ways to estimate N (and, hence, estimate K via Eq. 6). One way is to replicate the observations. If multiple spectrum images of the same scene are acquired, then the standard deviation of each observation can be estimated and used to populate the matrix N. Then, K can be estimated by using Eq. 6.

Alternatively, one can use an image that is the difference between the original image and the original shifted sideways by a pixel (or, perhaps, the average of two different single pixel-shifted images). Thresholding the shift-difference image can be used so that the edges don't dominate the results. Alternatively, the output of a laplacian of a gaussian filter can be used to estimate N. This filter can be the one built into the MATLAB® Image Processing Toolbox (or other equivalent math library), which outputs the difference between the original image and a gaussian-smoothed version of the original image. The filter can be easily tuned to vary how aggressively the image is filtered. Since N is highly diagonally dominant, the image intensity can be clipped in order to visualize the structure of off-diagonal elements. The expected correlations between strong spectral peaks (e.g., silver and copper signals) are readily observed.

Alternatively, other methods based on multiresolution image analysis can be used to estimate K, such as wavelet decompositions. The basic concept remains, namely, that K can be estimated from the data in a single image.

When the data is generated in a counting experiment, we know a priori the nature of the noise and can make use of that knowledge. An estimate of the standard deviation of each observation (e.g., measurement) is given by the square root of the number of counts in the observation. This results in a matrix N having the same dimensions as the weighted data matrix D, and K can be estimated with Eq. 6. It should be noted that for Poisson statistics, the diagonal of K computed according to Eq. 6 is exactly the mean spectrum. Thus, under the assumption that the errors are not correlated, a diagonal matrix having the mean spectrum placed along the diagonal is a good approximation to K. This can computed and appplied more quickly than the fully dense matrix K generated according to Eq. 6.

The approaches described above for weighting the data matrix A produce approximately identical final results for systems where the noise is dominated by counting statistics. The method based on a priori Poisson statistics is generally faster, however.

The foregoing methods have focused on accounting for unequal variance in the noise in the spectral dimension. However, this is only one-half of solving the Alternating Least Squares problem. In the other half, we assume we know S and then compute C by performing a least squares procedure. In principal, C could be weighted as well, but in the pixel dimension instead. In general, the need for weighting in the spatial (i.e., pixel) dimension is less. The reason is that the total number of counts per pixel should vary much less from pixel to pixel than the variation found from energy channel to energy channel (where we may be comparing peaks to background intensities). This has been our experience for real data sets comprising X-ray spectra. However, numerical simulations have been performed where unusually large pixel-to-pixel count variations were artificially introduced. In these simulations, better results were achieved by weighting the data by the inverse square of the mean image. That is, data matrix D is pre-multiplied by a diagonal G matrix whose diagonal is obtained by averaging the rows of D, then inverting and taking the square root. This step is not a computational expensive operation, compared to the overall procedure.

Step 16 in FIG. 6: Perform Constrained Alternating Least Squares Analysis

In step 16 the weighted spectral data matrix D is factored into the product of two matrices, C and $S^T$, according to $D=CS^T$. This factorization can be accomplished by performing a constrained Alternating Least Squares (ALS) analysis of Eq. 1 until an acceptable level of convergence of C and S is achieved. The constraint condition used in the constrained ALS procedure of step 16 can be a non-negativity constraint. Alternatively, the constraint condition can be chosen to track a physical attribute. The concentrations C can be constrained to be either monotonically increasing or decreasing over time, for example, when monitoring a chemical reaction over time. Alternatively, the concentrations C or spectral shapes S can be constrained to be unimodal. Alternatively, the spectral shapes S can be constrained to a fixed number of spectral peaks (e.g., a single peak for chromatography, or, to less than three peaks). Alternatively, the spectral shapes S can be constrained to match the shape of a Gaussian distribution.

Non-negativity constraints can be applied to the chemical concentrations and spectral emission intensities. The overall procedure used in an embodiment of the present invention is outlined in R. Bro. and S. De Jong, "A Fast Non-Negativity-Constrained Least Squares Algorithm", *Journal of Chemometrics*, Vol. 11, pp. 393401 (1997), which is herein incorporated by reference. The algorithm by Bro and De Jong is based on the standard algorithm NNLS developed by Lawson and Hanson, but subsequently modified to utilize the special characteristics of iterative algorithms involving repeated use of non-negativity constraints. Bro's algorithm has been implemented in MATLAB® code, and is available on his web site. However, we spent a couple of days writing our own implementation of his algorithm.

Figure 7:
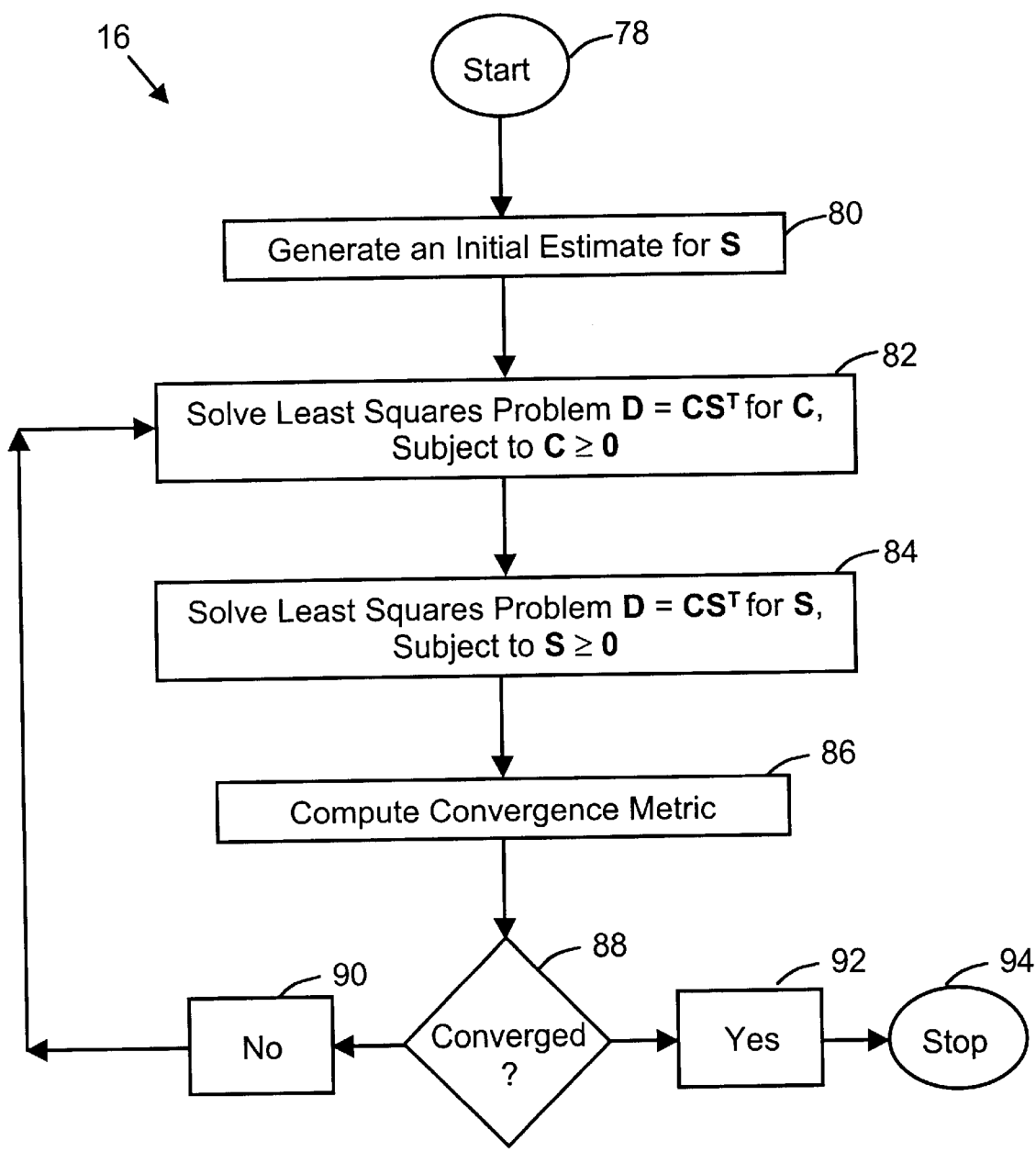
FIG. 7 illustrates a method for performing non-negativity constrained alternating least squares analysis, according to an embodiment of the present invention.

FIG. 7 illustrates an example of step 16 for performing non-negativity constrained alternating least squares analysis, according to the present invention. First, in step 80, we start by obtaining an initial feasible estimate for S. Next, in step 82, we solve Eq. 1 for C under the non-negativity constraint that all elements of C≧0. C and S can be full size matrices, or they can refer to the respective rank=q submatrices as obtained from PCA after performing dimensional reduction (i.e., compression). Eq. 1 can be solved for C as:

$$C=DS(S^TS)^{-1} \quad (7)$$

Next, in step 84, after the first estimate of C is obtained by solving Eq. 7, we then solve Eq. 1 for $S^T$ according to Eq. 8 under the non-negativity constraint that all elements of S≧0:

$$S^T=(C^TC)^{-1}C^TD \quad (8)$$

Next, in step 86, we compute a convergence metric, and then compare the metric to a convergence criterion in step 88. If the convergence metric is less than the convergence criterion, then convergence has been achieved and the procedure is completed. If not, then steps 82, 84, 86, and 88 are repeated (i.e., iterated) as many times as is needed until an acceptable (i.e., sufficient) level of convergence is achieved. The active constraint sets can be preserved upon successive iterations to enhance convergence speed, following the algorithm described by Bro and De Jong (ibid.)

The convergence metric in step 86 can be computed for each spectral vector separately, where the residual $R_j$ is taken to be the sum of the squared differences between successive ALS iterations, according to Eq. 9, which represents the square of the 2-norm of the difference vector:

$$R_j = \|S_{n+1}^j - S_n^j\|_2^2 \quad (9)$$

Where $S_n^j$ is the $j^{th}$ spectral component at the $n^{th}$ iteration. The Intel Signal Processing Library has a routine "NSPD-NORM" that directly computes the 2-norm, i.e., the square root of $R_j$ as defined above. Once a suitably low value of the residual $R_j$ is achieved, $S^j$ can be removed from the iteration, according to Eq. 10:

$$D'(D-C^jS^{jT})=C'S' \quad (10)$$

where $C^j$ is the $j^{th}$ column of C, and $S^{jT}$ is the $j^{th}$ row of $S^T$ Alternatively, the removal of $S^j$ can be omitted. The process is continued until all spectral components of S have sufficiently converged.

The vectors in S can be maintained as unit vectors, thus, a single dimensionless value can be used for a convergence criterion. Experimental results showed that a reasonable value of a convergence criterion can be a value of $10^{-6}$, which represents a reasonable balance between improved accuracy and increased computation time. Since the ALS procedure is the most time-consuming part of the entire multivariate data analysis process, the crossproduct algorithm described in Bro and De Jong (Ibid.) was used for the constrained least squares step in the present invention, together with the Intel Math Kernel Library BLAS routine "DGEMM" to most efficiently compute the large matrix crossproducts. In the present example, excellent results were obtained after performing twenty-five ALS iterations. In general, however, the number of iterations necessary to achieve sufficient convergence depends on how orthogonal the pure components are. Our experience is that less than one hundred iterations are typically needed. A useful termination criterion can be: (a) all components converged, or (b) one-hundred iterations, whichever comes first.

When we say that all $S^j$ are maintained as unit vectors, there is an implied scaling that should also be applied to the corresponding $C^j$. Assume that we have computed estimates for C and $S^T$. In general, the rows of $S^T$ are not unit vectors. To make them unit vectors, we can divide each element of the row by the 2-norm of the row. This is equivalent to pre-multiplying $S^T$ by the inverse of a diagonal matrix N where N is constructed by putting the row 2-norms of $S^T$ on the diagonal. In order to maintain the equality $D=CS^T$, we need to post-multiply C by N. That is:

$$D=CS^T=CNN^{-1}S^T=(CN)(N^{-1}S^T)=C'S_u^T \quad (11)$$

where the columns of $S_u$ are now unit vectors, and where C' is a scaled concentration intensity matrix.

The previous discussion has focused on starting with an initial estimate for S, and then solving Eq. 1 for C, and so on. However, the roles of C and S can be easily interchanged. Consider the transpose of Eq. 1, namely, $D^T=SC^T$. In this case, it would be possible to generate an initial estimate for C first. This could be used in the case where there are fewer pixels than energy channels, since the dimension of the cross product matrix will be the smaller of: the number of pixels or the number of channels. In this case, the rows of D would be weighted, and, then, the resultant columns of C would be unweighted.

Step 80 in FIG. 7: Generate Initial Estimate for S

A variety of methods can be used to generate an initial guess or estimate for S. Eigen Value Decomposition (EVD) or Singular Value Decomposition (SVD) can be used (details will be provided later).

Other methods can be used to generate an initial estimate for S. For example, If the dominant elements or phases are already known (or suspected from prior experience with similar samples), then a simple approach is to look up in a book or lookup table the spectrum for those elements, and then use those spectrums for the initial estimate of S. However, this approach would not work if the sample is unknown, or if unknown trace elements or contaminants are suspected.

Alternatively, we can initially estimate S by performing an Orthogonal Projection Approach (OPA), such as described in "Rapid Analysis of Raman Image Data Using Two-Way Multivariate Curve Resolution", by J. J. Andrew and T. M. Hancewicz, in *Applied Spectroscopy*, Vol. 52, No. 6. 797–807 (1998), which is herein incorporated by reference. The Intel MKL BLAS routine "DSYEV" can be used to compute only the eigenvalues, which can be used to find the number of pure components q for input to the Orthogonal Projection Approach.

Alternatively, an initial estimate for S can be generated by selecting a series of random numbers. In this case, the proper number of components can be selected based on a signal-to-noise criterion. One example of generating a signal-to-noise (S/N) criterion is to compute the ratio of the maximum value in a pure spectrum to the median value and call the component real if this ratio exceeds some threshold. Another approach is to compute the ratio of the power in a low pass filtered version of a pure component to a high pass filtered version of the same component. A third approach is to correlate a computed pure component with library spectra for all elements. All of these are S/N-based criterion, in the sense that if there is too much noise we will not be able to identify a spectral feature in the pure component.

No matter which approach is used to generate an initial estimate for S, the elements of S should satisfy the constraints that are chosen for a specific analysis.

Step 18 in FIG. 6: Unweighting the Converged Matrices C and S

After convergence of C and S is obtained in step 16, the next step is to unweight the resultant converged matrices C and S. We get back to the original space by inverting the weighting matrix H and performing a similar matrix multiplication. This transforms the results into the proper, physically realizable "spectral" space. For the case where H is a diagonal matrix, this is accomplished by dividing each vector element-wise by the weighting vector obtained previously in step 14. For the case of Poisson weighting, this can be accomplished by element-wise multiplication of each converged spectral vector in S by the square root of the corresponding elements of the mean spectrum vector of A.

Generally, we need to undo any of the weighting that we have done. Thus, if we also weight the rows of D, we will need to unweight the columns of C by multiplying C by the inverse of the matrix used to weight the rows of D.

Step 20 in FIG. 6: Determine Properties of Sample by Inspecting C and S

The properties of the sample are determined in step 20 by inspecting the resultant converged matrices C and S. Inspecting the converged matrix C can include, for example, displaying the results on a computer monitor, or printing or plotting a two-dimensional image representing the values of the concentration intensity in C for a selected chemical species contained within C (see, for example, FIG. 4). Inspecting the converged matrix S can include, for example, displaying the results on a computer monitor, or printing or plotting an X-Y plot of the spectral shape of a selected chemical species contained within S (see, for example, FIG. 5).

Determining the properties of the sample can further include identifying the individual spectral peak(s) comparing the converged spectra of S with known spectrum signatures for known elements and phases, and alloys (e.g., computed by AutoID or DTSA).

The concentration intensity matrix C represents the amount of the normalized shapes S that we need to reproduce the data in a least squares sense. However, in order to determine an actual or real chemical concentration (e.g., weight % of a given element or selected chemical species) a calibration can be performed that converts the "concentration intensity" to a real or actual chemical concentration. Hence, the step of determining the properties of the sample can include the method and means needed to perform and apply a calibration step that converts the "concentration intensity" to a real chemical concentration.

Figure 8:
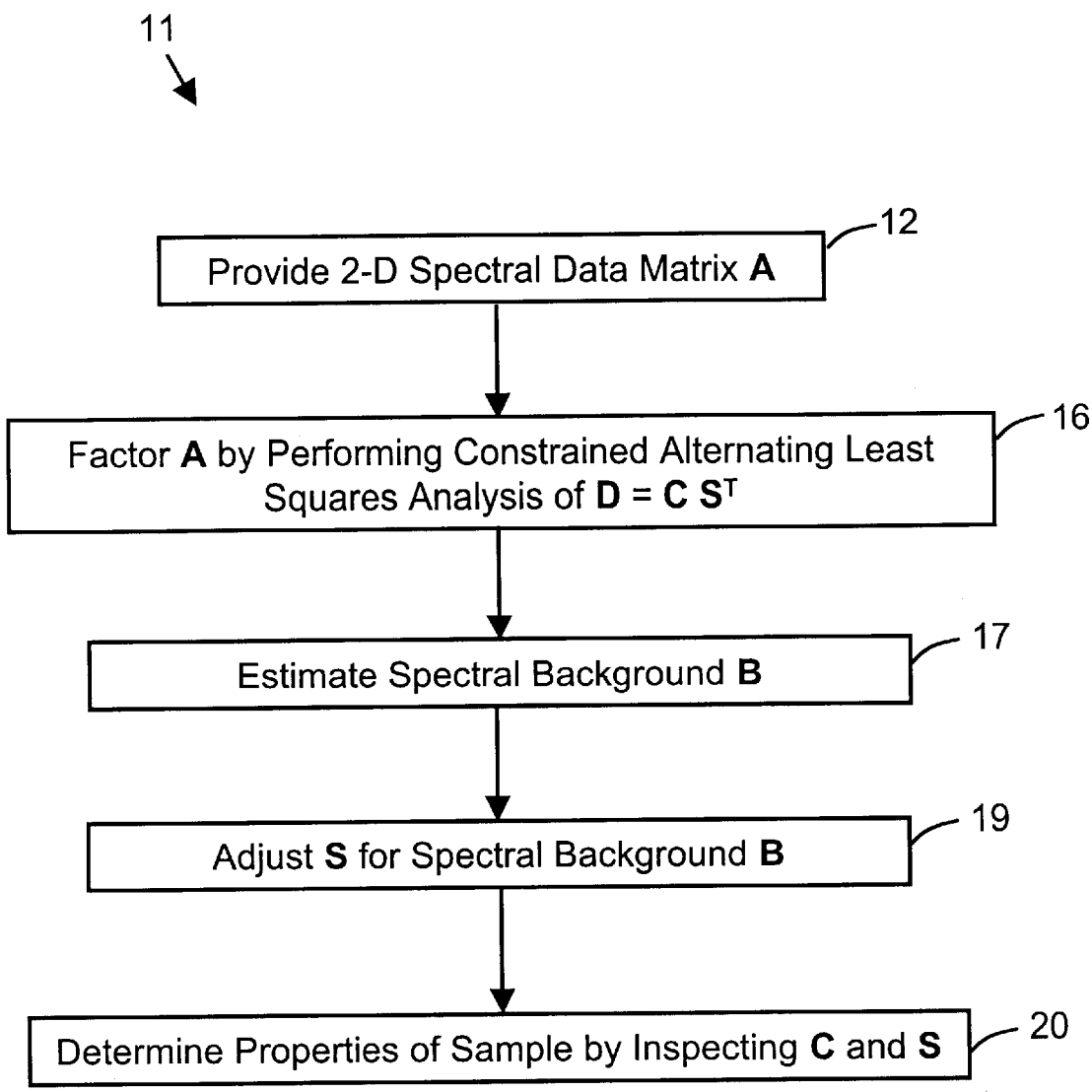
FIG. 8 illustrates a method for performing multivariate spectral analysis, according to an embodiment of the present invention.

Method According to FIG. 8

FIG. 8 illustrates another method for determining the properties of a sample from measured spectral data, according to an embodiment of the present invention. Method 11 comprises a series of sequential steps that can be executed by a computer. First, in step 12, a two-dimensional measured spectral data matrix A is provided. Next, A is factored into the product of two matrices, C and $S^T$. This factorization can be accomplished in step 16 by performing a constrained Alternating Least Squares (ALS) analysis of Eq. 1 until an acceptable level of convergence of C and S is achieved. The constraint condition can be a non-negativity constraint. Next, in step 17, a spectral background matrix B is estimated. Then, in step 19, the matrix S is adjusted for the spectral background matrix B. Finally, the properties of the sample are determined in step 20 by inspecting the converged matrices C and S.

Step 17 of FIG. 8: Spectral Background Estimation

Interpreting and analyzing the spectrum of radiation emitted by a sample involves estimating and correcting for any continuum (i.e., background) signal.

Referring now to the example of X-ray spectroscopy, a background of continuum (i.e., Bremsstrahlung) X-radiation is produced by the slowing down of incident energetic electrons in the bulk of the sample. The background signal increases with increasing atomic number (Z), and is proportional to the concentration of the chemical constituents of the sample. This causes the strength of the background signal to be proportional to the strength of the total signal of a given analyte (i.e., component). Consequently, PCA produces pure component spectra that are convoluted (i.e., convolved) with the background signal. Hence, the larger the background is, the larger the degree of convolution.

The background continuum radiation (i.e., background) can be estimated with a best-fit approximate model. The backgrounds (one for each spectrum) can be estimated as linear combinations of shapes based on physical models, plus an optional offset. The backgrounds can be fitted using a robust statistical technique, such as least median of squares or least trimmed squares. These methods are described in greater detail in a paper by D. M. Hawkins and D. J. Olive, "Improved Feasible Solution Algorithms for High Breakdown Estimation", *Computational Statistics and Data Analysis*, Vol. 30 (1999), pp. 1–11, which is herein incorporated by reference.

The basic assumption, according to an embodiment of the present invention, is that at least p/2+1 channels in the spectrum (where p is the total number of energy channels) fall on the background. In this model, the spectral features (i.e., spectral peaks) are treated as "outliers" and are excluded from the least squares fit. Faster convergence is achieved by assuming that the median point of the spectrum lies on the background. Selecting the p/2+1 points about the median provides a better starting point than using a random selection, and corresponds to the least median of squares. If needed, the channels selected for fitting can be partially constrained to ensure relatively uniform coverage over the entire energy range. A relatively uniform distribution of points to be fit is assured by selecting one-half of the points from each of the low and high-energy halves of the spectrum. We only satisfy the "weak" criterion described in Hawkins and Olive (ibid.). We use non-negativity constrained least squares (such as NNLS) to fit the background shapes to the selected points. The fitting algorithm comprises the following steps:

(1) select p/2+1 points;
(2) use the NNLS routine to fit to background shapes;
(3) select the p/2+1 points having the smallest residuals; and
(4) if this set is the same set of points as we fit, then we are done; else go back to step (2).

Figure 17:
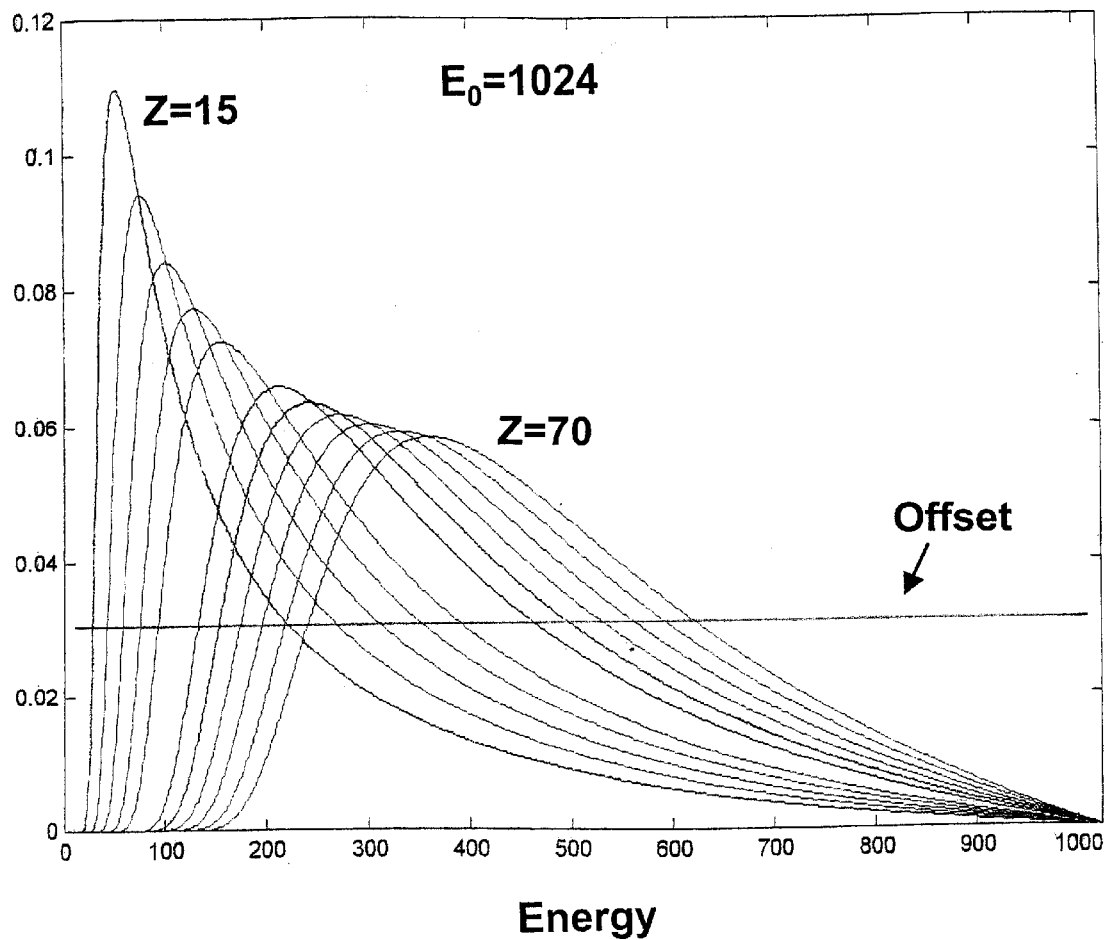
FIG. 17 illustrates a family of background shapes for Z=15, 20, 25 . . . 70, and for $E_0$=10 KeV, according to an embodiment of the present invention.

For energy dispersive spectrometry (EDS), an appropriate physical model can be:

$$I = z \frac{(E_0 + E)}{E} \exp(-z^4/E^3) \quad (12)$$

where I=background intensity, Z is the atomic number, $E_0$ is the primary beam energy, and E is the variable photon energy. A sample family of background shapes for Z=15, 20, 25 . . . 70, and for $E_0$=10 KeV, are illustrated in FIG. 17.

Alternatively, the number of points, r, can be selected with r≧p/2+1, to include the possibility of using least trimmed squares in the fitting algorithm described above.

Alternatively, the method of the present invention could identify, on the fly (i.e., in real time), the major elements that comprise the pure component. Then, software akin to DTSA (Desktop Spectrum Analyzer, freely available from NIST) can be used to generate a physically accurate background shape for that particular combination of elements, and fit that shape to the pure component spectrum.

Step 19 in FIG. 8: Adjust S for Spectral Background B

After estimating the spectral background B, the matrix S is adjusted to be consistent with the fitted background B. Two different method for accomplishing this adjustment will be described later on, with specific reference to FIGS. 9 and 10.

Figure 9:
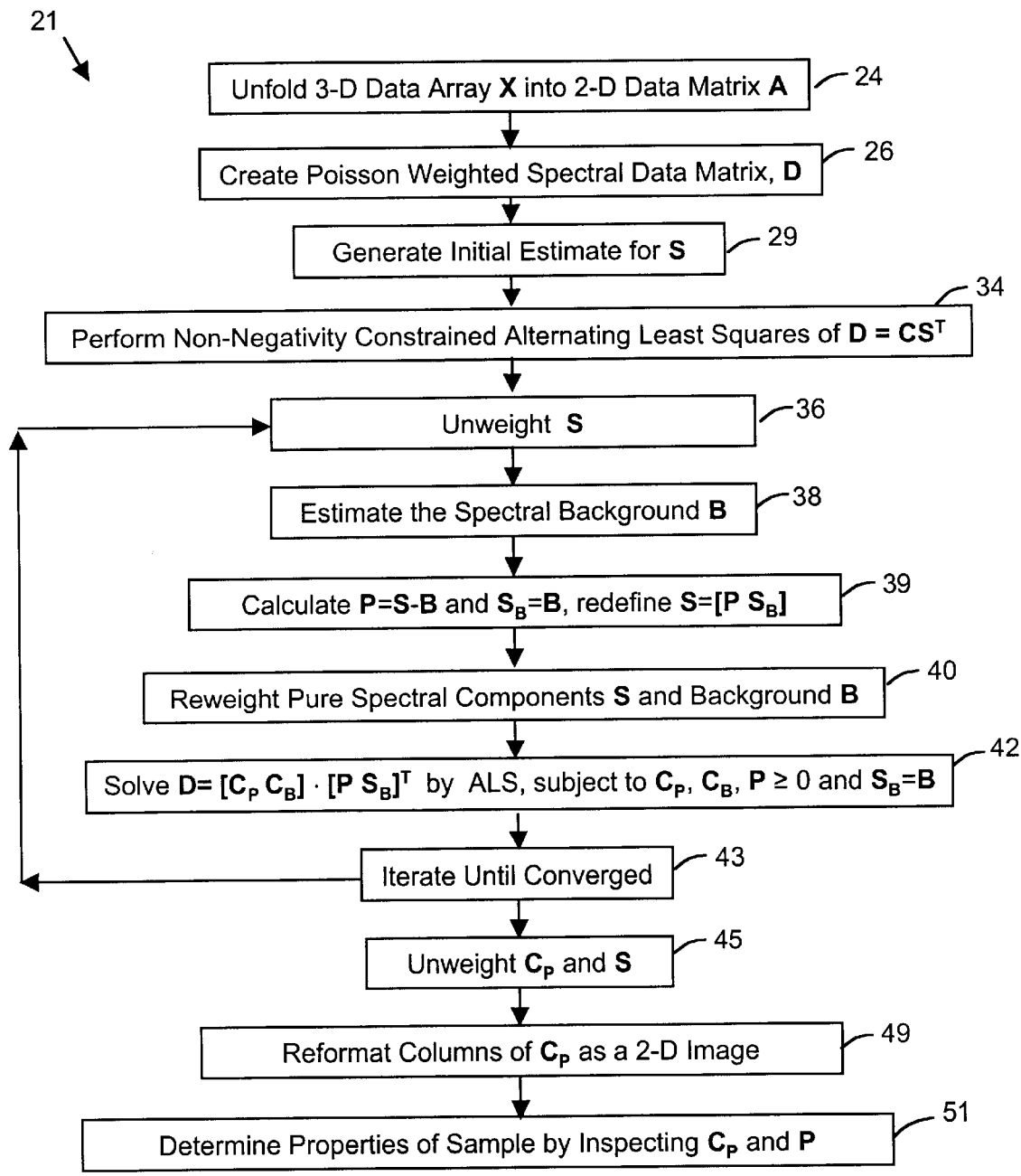
FIG. 9 illustrates a method for performing multivariate spectral analysis, according to an embodiment of the present invention.

Method According to FIG. 9

FIG. 9 illustrates another method for determining the properties of a sample from measured spectral data, according to an embodiment of the present invention. Method 21 comprises a series of sequential steps that can be executed by a computer. First, in step 24, a three-dimensional data array X is unfolded to form a two-dimensional data matrix A. Next, in step 26, matrix A is weighted using Poisson statistics to create a Poisson weighted spectral data matrix D. Then, in step 29, an initial estimate for S is generated. Next, in step 34, the initial estimate for S is used as a starting point for performing a non-negativity constrained Alternating Least Squares (ALS) analysis, according to Eq. 1. Iteration is continued until an acceptable level of convergence of S (and presumably C) is achieved. The non-negativity constraints are C≧0 and S≧0. Then, in step 36, the matrix S is unweighted by applying the inverse of the weighting procedure that was used initially in step 26. Next, in step 38, the spectral background B for each pure spectral component is estimated by fitting the converged pure spectral components S to a linear combination of basic background shapes, plus an optional offset, using a robust statistical method. Next, in step 39, we calculate P=S−B and $S_B$=B, and redefine S=[P $S_B$]. Next, in step 40, the matrices S and B are reweighted using the same weighting procedure from step 26. Then, in step 42, we solve D=$[C_P C_B]$·$[P \ S_B]^T$ by performing Alternating Least Squares analysis (ALS), subject to $C_P$, $C_B$, P≧0 and $S_B$=B. Then, in step 43, we iterate steps 36, 38, 39, 40, and 42 until convergence is achieved. Next, in step 45, we unweight the matrices $C_P$ and S. Then, in step 49 the columns of $C_P$ are reformatted to allow creation of one or more 2-D "concentration intensity" image maps. Finally, in step 51 the properties of the sample are determined by inspecting the converged matrices $C_P$ and P.

Step 24 in FIG. 9: Data Set Unfolding

Figure 11:
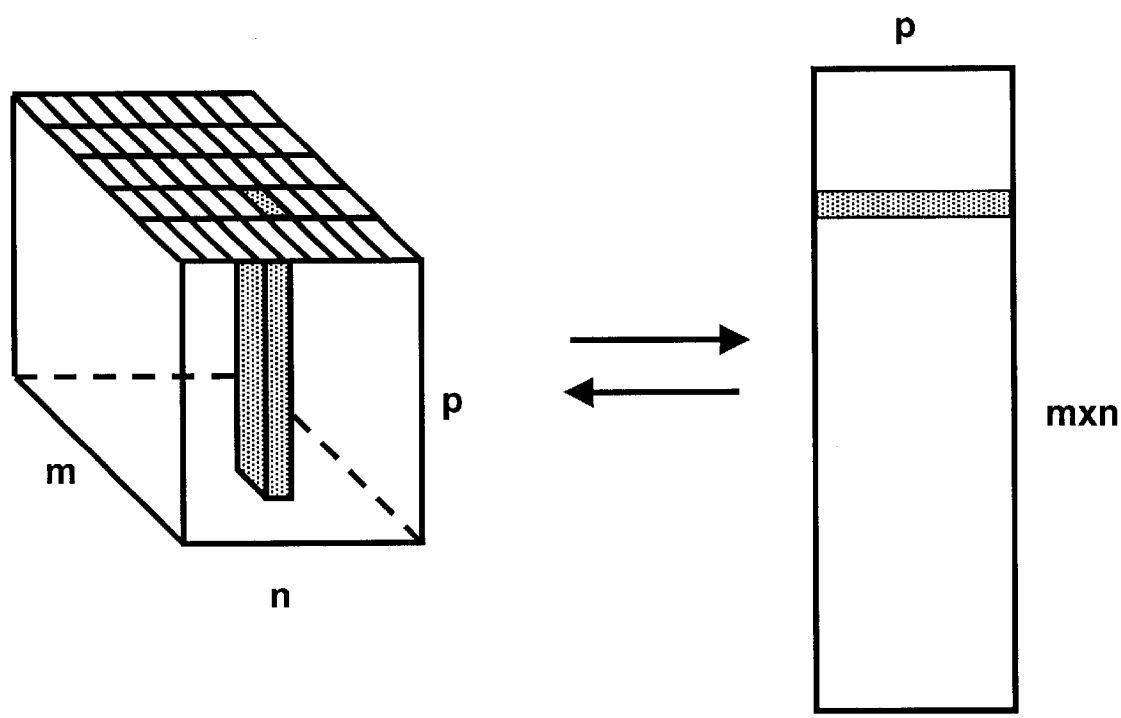
FIG. 11 illustrates a method for unfolding a 3-D data array into a 2-D data matrix, according to an embodiment of the present invention.

In order to simplify the calculations, and to enable the application of familiar linear algebra techniques, the 3-D spectral data array X of dimensions (m×n×p) can be re-organized or "unfolded" to form a two-dimensional data matrix A. The first two dimensions of array X represent the (X, Y) spatial coordinates of m and n pixels, respectively, that compose the 2-D image, and the third dimension consists of p spectral variables, e.g., the intensities or number of counts in each of the p energy channels. This unfolding step is illustrated in FIG. 11. The transformation and subsequent analysis neglects spatial correlations among pixels. That is, the rows of the matrix A could be randomly interchanged with each other and the same final results would be achieved. This does not pose a severe limitation, however, when trying to account for independent sources of spectral variation. Once the numerical analysis has been completed, the results matrices can be easily refolded or organized back into a three-dimensional data "cube" configuration to facilitate the 2-D image display (e.g., concentration intensity images or elemental maps) and interpretation of the results. This can be accomplished by reformatting the columns of C (or $C_P$) as one or more two-dimensional images.

After unfolding the 3-D data array X into 2-D matrix A, the spectrum at any pixel can be thought of as a vector in a p-dimensional space, Where p is the total number of energy channels in the spectrum (e.g., 1024 channels), and where the vector occupies a specific row of matrix A corresponding to that pixel. Accordingly, the 2-D multivariate image can be described as a collection of m×n spectra, (where m×n equals the total number of pixels, $N_{pixels}$, in the image) and where each pixel's spectrum has a total of p spectral elements corresponding to p energy channels.

For a hyperspectral image, p may be on the order of 1000. However, the number of chemically relevant components (elements and phases) in a sample typically number in the ones to tens (e.g., less than twenty-five). Thus, an useful step in improving the efficiency of the multivariate spectral analysis process is to reduce or compress the dimension of the problem by gathering all of the chemically relevant information into a reduced number of dimensions (q) that is consistent with the number of chemical phases present. Matrix factorization techniques, such as Principal Components Analysis (PCA), can generate eigenvalues that are useful for accomplishing this dimensional reduction.

If the EDS (or other spectrometer) outputs the measured spectral data already organized into a 2-D matrix format, for example, as a 2-D data matrix A, then step 24 can be skipped.

Steps 42 in FIG. 9: Solve for $C_P$ and P by Alternating Least Squares

In the general situation where the contribution from the background to the total measured signal may be significant, we can write more generally:

$$S=P+B \tag{13}$$

where B is the non-specific background, and P is the "pure component spectral shape in the absence of background". Hence, we can write:

$$D=CS^T C(P+B)^T \tag{14}$$

An even more general expression can be generated by allowing the concentrations of P and B to vary independently (which would allow the background to vary in intensity with the overall composition at a given pixel). In that case, we can write:

$$D=CS^T=C_P P^T+C_B B^T=[C_P C_B]\cdot[P\ B]^T \tag{15}$$

Here, the notation [x y] represents a single matrix that is the concatenation of the separate matrices x and y. Note that the number of columns in [x y] is the sum of the number of columns in x and y, or in the present case, 2q columns.

Hence, in step 42, we solve $D=[C_P C_B]\cdot[P\ S_B]^T$ by performing Alternating Least Squares analysis (ALS), subject to $C_P$, $C_B$, $P \geq 0$ and $S_B = B$.

If the background B is relatively small (so that subtracting B from S yields only a minor perturbation on P), then, performing a single iteration in step 44 can yield a sufficiently converged answer. Note that the data matrix D is being modified during this procedure; in effect, we are subtracting the background out of the data.

Figure 10:
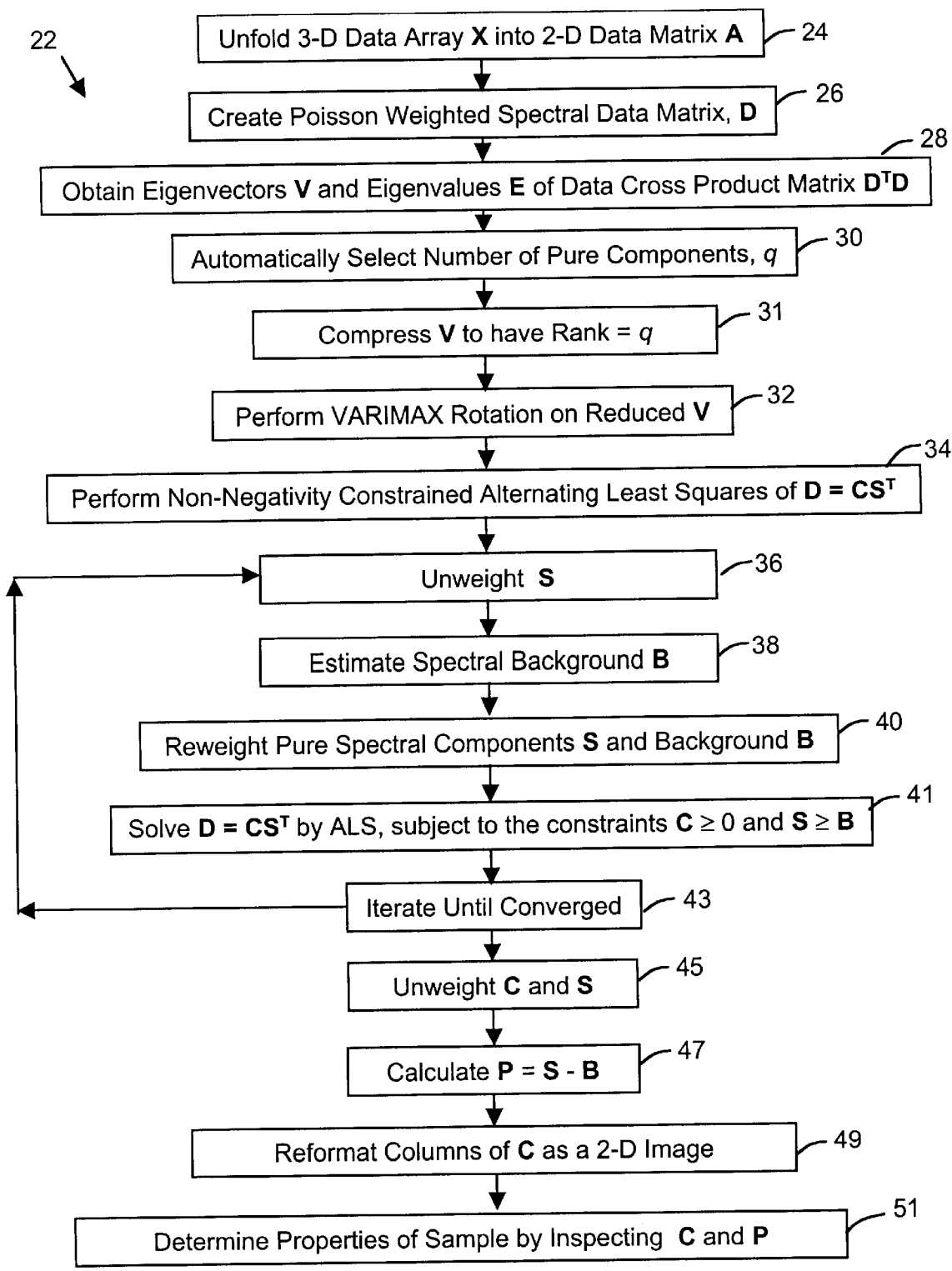
FIG. 10 illustrates a method for performing multivariate spectral analysis, according to an embodiment of the present invention.

Alternatively, if the background B is relatively large, then the procedure outlined next with respect to FIG. 10 can be used.

Method According to FIG. 10

FIG. 10 illustrates another method for determining the properties of a sample from measured spectral data, according to an embodiment of the present invention. Method 22 comprises a series of sequential steps that can be executed by a computer. First, in step 24, a three-dimensional data array X is unfolded into a two-dimensional data matrix A. Next, in step 26, the 2-D data matrix A is weighted using Poisson statistics to create a Poisson weighted spectral data matrix D. Next, in step 28, the eigenvectors V and eigenvalues E of the data cross product matrix $D^T D$ are obtained by performing an eigenvalue decomposition (EVD) of $D^T D$. In general, eigenvalues E describe the amount of spectral variation accounted for by each of the eigenvectors V. Next, in step 30, the proper number, q, of statistically significant pure spectral components (i.e., the number of chemically relevant eigenvectors) is automatically selected. Next, in step 31, the full size matrix V is compressed (i.e., dimensionally reduced) into sub-matrix S having a rank=q. Next, in step 32, an orthogonal VARIMAX rotation is performed on the corresponding reduced set of eigenvectors S. After rotation, the sign is selected so that the rotated vectors S are predominantly positive, and, then, all negative values are set to zero. Next, in step 34, the adjusted, physically relevant, VARIMAX-rotated vectors S are used as a starting point (i.e., initial estimate) for performing a non-negativity constrained Alternating Least Squares (ALS) analysis, according to $D=CS^T$. Iteration is continued until an acceptable level of convergence of S (and presumably C) has been achieved. The non-negativity constraints are $C \geq 0$ and $S \geq 0$. Then, in step 36 the matrix S is unweighted by using the inverse of the weighting procedure that was used initially in step 26. Next, in step 38, the spectral background B for each pure spectral component is estimated by fitting the converged pure spectral components S to a linear combination of basic background shapes, plus an optional offset, using a robust statistical method. Next, in step 40, matrices S and B are reweighted using the same weighting procedure from step 26. Then, in step 41 we solve $D=CS^T$ by performing alternating least squares subject to the constraints $C \geq 0$ and $S \geq B$. Next, in step 43, we iteratively repeat preceding sequential steps 36, 38, 40, and 41 until the solution converges. After convergence, in step 45, we unweight the matrices C and S. Next, in step 47, we estimate P by calculating subtracting B from S. Then, in step 49 the columns of C are reformatted to allow creation of one or more 2-D "concentration intensity" image maps. Finally, in step 51, the properties of the sample are determined by inspecting the converged matrices C and P. Large spectral backgrounds B can be handled since the background estimation step 38 is iterated.

Step 28 in FIG. 10: Obtain Eigenvectors V of Data Cross Product Matrix $D^T D$ In step 28, the eigenvectors V and eigenvalues E of the data cross product matrix $D^T D$ are obtained. The eigenvectors V provide abstract representations of the spectra of the individual chemical components (e.g., elements or phases). For example, if we have a 1024 channel spectrum (i.e., p=1024), the normal SVD or EVD methods will generate 1024 singular values or eigenvalues E, respectively, and 1024 corresponding eigenvectors V.

This procedure relates to Principal Components Analysis (PCA), which is a strategy based on the statistical properties of a signal having coherent data that are mutually strongly correlated, and can be expressed, in general, by a covariance matrix. The covariance matrix is symmetric positive definite. Positive symmetry implies the existence of a set of mutually orthogonal eigenvectors (i.e., principal components). A representation of the covariance matrix in the basis determined by its eigenvectors is a diagonal matrix, where the on-diagonal elements are the respective eigenvalues (i.e., variances) associated with the eigenvectors, and the off-diagonal elements are equal to zero. The mapping of the covariance matrix onto the basis of its eigenvectors is commonly referred to as the Principal Component Transform, Eigenvector Transform, Hotelling Transform, or Karhuen-Loe've Transform. The diagonal form expresses the fact that the accordingly transformed data now are uncorrelated (since the off-diagonal components are equal to zero). This transformation is conventionally used in data compression, feature extraction, and encoding routines. By decomposing the data into a set of uncorrelated factors of decreasing statistical significance, data compression can be accomplished by selecting those factors having the greatest statistical significance and, then, discarding the rest as noise or error.

From a geometric point of view, PCA begins by finding that single direction in the p-dimensional space that best describes the location of the data within the space. The vector describing that direction is the first principal component. Once found, a second direction orthogonal to the first is determined that best accounts for the variation in the data that is orthogonal to the first direction. This is the second principal component. The process continues with each new principal component maximally accounting for the variation in the data that is orthogonal to all preceding components. The first few (e.g., less than twenty-five) principal components will typically contain the chemical information of interest. If there are q such components, then the remaining p–q components describe experimental noise or error. Limiting further analysis to the q-dimensional subspace defined by the q principal components can provide the desired dimensional reduction and data compression.

In the present invention, PCA can be performed for at least two reasons. First, PCA can generate the eigenvalues E that can be used to select the proper number of principal components (q) to retain in subsequent analyses (such as ALS). Second, PCA can generate the eigenvectors V that can be input to a VARIMAX procedure (whose output provides an initial estimate of S prior to starting the Alternating Least Squares Analysis).

The eigenvectors can be ordered in decreasing (or increasing) eigenvalues. Each row of the original data matrix D can be represented as a linear combination of all principal components in the loading matrix S. Consequently, the weighted spectral data matrix D can be reconstructed, within the measurement error R, by taking the first q principal components:

$$D = C'S'^T + R \quad (16)$$

where the symbol * means that the first q significant columns of S and C have been retained (i.e., rank=q). Hence, after compression, C* has dimensions $N_{pixels} \times q$, and S* has dimensions of p×q, (while D remains the same as before).

PCA is traditionally computed by performing a Singular Value Decomposition (SVD), which, however, can be a time consuming process. For example, a typical PCA of a 128× 128×1024 image using MATLAB's (Ver. 5.3) own built-in Singular Value Decomposition (SVD) routine took over one hour on a Dell Precision 410 PC using a single Pentium III processor at 500 MHz, with 1 GB of RAM and 18 GB of hard disk memory. This is much longer than a typical data acquisition time of ten minutes on a SEM with attached EDS. However, a factor of ten speedup was achieved, according to an embodiment of the present invention, by using processor-optimized linear algebra libraries. For example, using the LAPACK Ver. 3.0 singular value decomposition routine "DGESDD", and using Pentium-III optimized BLAS routines from the Intel Math Kernel Library V3.2, reduced the computation time to approximately 7 minutes (when called as .mex files from MATLAB®). Alternatively, the single-precision version of the LAPACK routine, "SGEDD" could be used in place of the double-precision routine, "DGESDD". Use of single-precision BLAS and LAPACK routines generally reduces computation time at the expense of reduced solution accuracy and precision.

In the typical case that the number of spectra or pixels is greater than the number of energy channels, additional savings in time can be achieved by reformulating the PCA factorization as an EVD (eigenvalue decomposition) problem, rather than as a SVD (singular value decomposition) problem. Hence, we can write:

$$D = CS^T = U\Sigma V^T \quad (17)$$

where S=V, U and V are orthonormal matrices, and Σ is a diagonal matrix with the singular values ordered by decreasing size along the diagonal. The actual eigenvalues are equal to the squares of the corresponding singular values in Σ. FIG. 12 illustrates schematically the relationship between PCA and SVD. We can write an expression for the cross product matrix $D^T D$ as:

$$D^T D = (U\Sigma V^T)^T (U\Sigma V^T) = V\Sigma^2 V^T \quad (18)$$

Since U is orthonormal, then $U^T U = I$ (the identity matrix). According to the present invention, the matrix U doesn't need to be computed. Consequently, Eq. 18 can be rewritten as:

$$D^T D = V\Sigma^2 V^T \quad (19)$$

Therefore, by inspection of Eq. 19, we recognize that the desired spectral vectors V can be computed by performing an eigenvalue decomposition (EVD) of the data cross product matrix $D^T D$.

In general, the combination of forming the cross product matrix $D^T D$, and then performing EVD, is a faster procedure than doing SVD, especially when $N_{pixels} >> p$ (as it is in the present example of a 2-D full spectrum image).

Alternatively, when $N_{pixels} < p$ (as would be the case for a spot X-ray analysis, for example), an eigenvalue decomposition (EVD) of the association matrix $DD^T$ can be performed, whereby the resulting eigenvectors would be initial estimates for the matrix C. Performing an EVD on $DD^T$ to get spectral estimates could still be done, but performing SVD would generate the spectral estimates more quickly in this case.

After selecting the proper number of components q (i.e., determining the rank of V), then C can be computed as:

$$C = (DS)(S^T S)^{-1} \quad (20)$$

where the dimensions of S and C have been reduced to the rank q of V (i.e., S=S* and C=C*). Thus, only the vectors of C corresponding to the chemically relevant spectral components are computed.

The Intel MKL BLAS routine "DSYRK" can be used to compute the cross product matrix $D^T D$, and the LAPACK routine "DSYEVD" can be used to compute the eigenvalue decomposition. The output of this process includes a vector of eigenvalues E, which describe the amount of spectral variation accounted for in each of the eigenvectors V. Subsequently, using built-in MATLAB® routines to solve for C, the total PCA process used only approximately 1.5 minutes. This is a factor of forty less time than using the original MATLAB's own built-in SVD routine.

Figure 13:
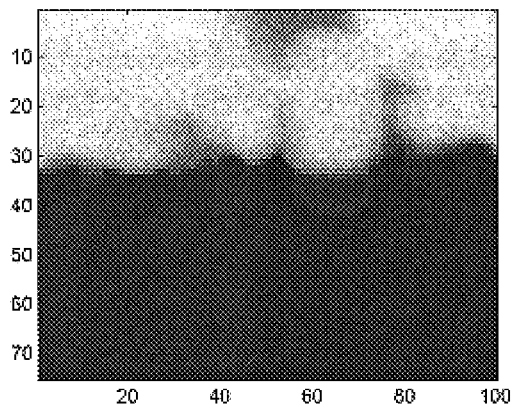
FIG. 13 illustrates examples of selected components from the score vectors C after PCA, reformatted as a 2-D image, corresponding to the four largest eigenvalues obtained from an analysis of the sample shown in FIG. 4, according to an embodiment of the present invention.
Figure 13:
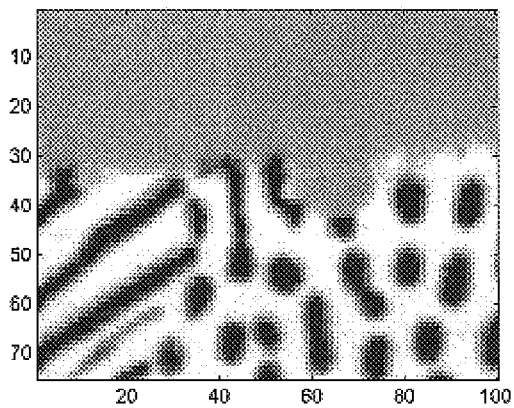
Figure 13:
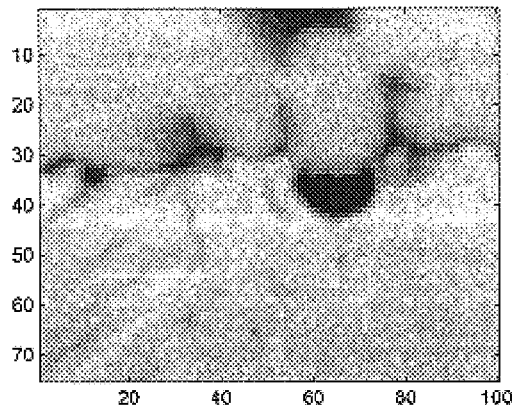
Figure 13:
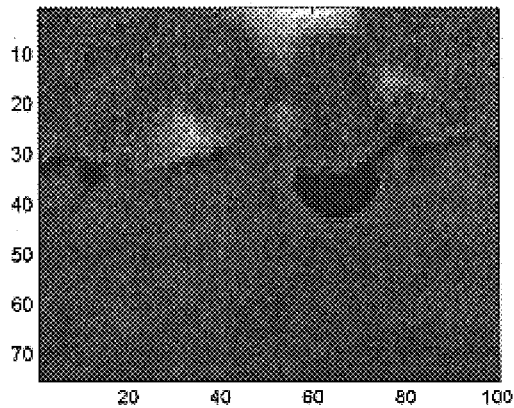

FIG. 13 illustrates examples of four selected components from the score vectors C, reformatted as a 2-D image of concentration intensities, corresponding to the four largest eigenvalues obtained from a PCA analysis of the sample shown in FIG. 4, according to an embodiment of the present invention. These have been refolded and scaled for display as 8-bit grayscale images. The intermediate results shown in FIG. 13 represent the results after step 28 in FIG. 10 has been performed. Note that the contrast between the various chemical phases is very good and at least five distinct phases are clearly evident. The art of chemical characterization consists in selecting the proper number of components to retain in the analysis, or in numerical terms, determining the column rank q of the data matrix D.

Figure 14:
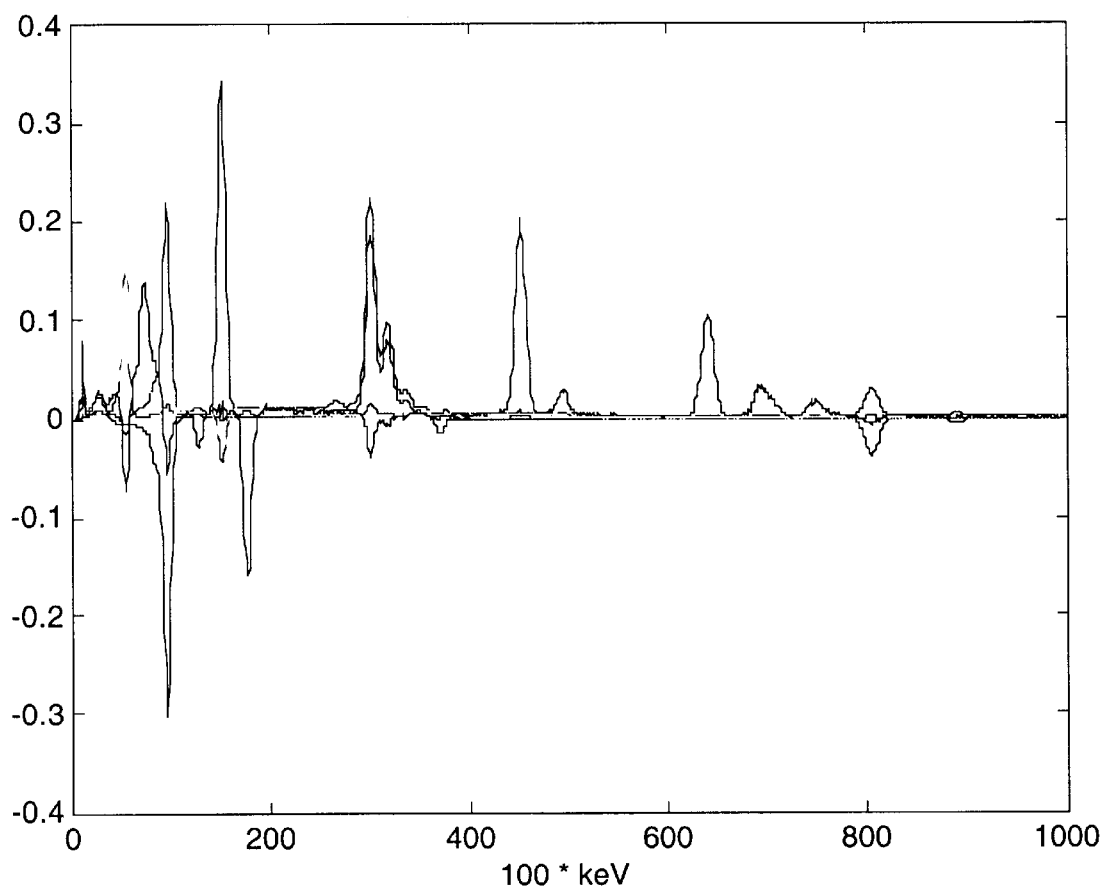
FIG. 14 illustrates examples of the loading vectors S after PCA, corresponding to the five largest principal components obtained from an analysis of the sample shown in FIG. 4, according to an embodiment of the present invention.

FIG. 14 illustrates an example of five selected components from the loading vectors S corresponding to the five largest principal components obtained from a PCA analysis of the sample shown in FIG. 4, according to an embodiment of the present invention. The intermediate results shown in FIG. 14 represent the results after step 28 in FIG. 10 has been performed. A comparison with the average spectrum shown in FIG. 5 shows that the loading vectors in FIG. 14 share many similarities with the observed spectral features, but that several notable differences are found as well. For example, the loading vectors have both positive and negative components whereas the emission intensities are all positive. We would also expect that spectral features indicative of a given element would only be associated with phases containing that element. That this is not the case is evident by noting that the double peak feature near 3.0 KeV represents silver and, yet, is present in all five vectors. Both of these effects are consequences of enforcing orthogonality of the loading vectors, a constraint that need not apply to real spectra. The end result is that PCA produces a set of principal component spectra in an abstract mathematical sense. The loading vectors contain the spectral information, but not in a form that is readily interpreted in chemical terms.

Further refinement of the intermediate results shown, for example, in FIG. 13 and FIG. 14 can be achieved by subsequently performing a constrained Alternating Least Squares Analysis.

Step 30 in FIG. 10: Automated Selection of the Number of Pure Spectral Components q Traditionally, the user manually selects the proper number of chemical species or components present in the system, prior to performing an Alternating Least Squares (ALS) analysis. However, this generally requires expert knowledge and considerable experience. We have developed, in the present invention, an automated method for selecting the number of pure spectral components that requires no expert knowledge or user intervention.

Figure 15:
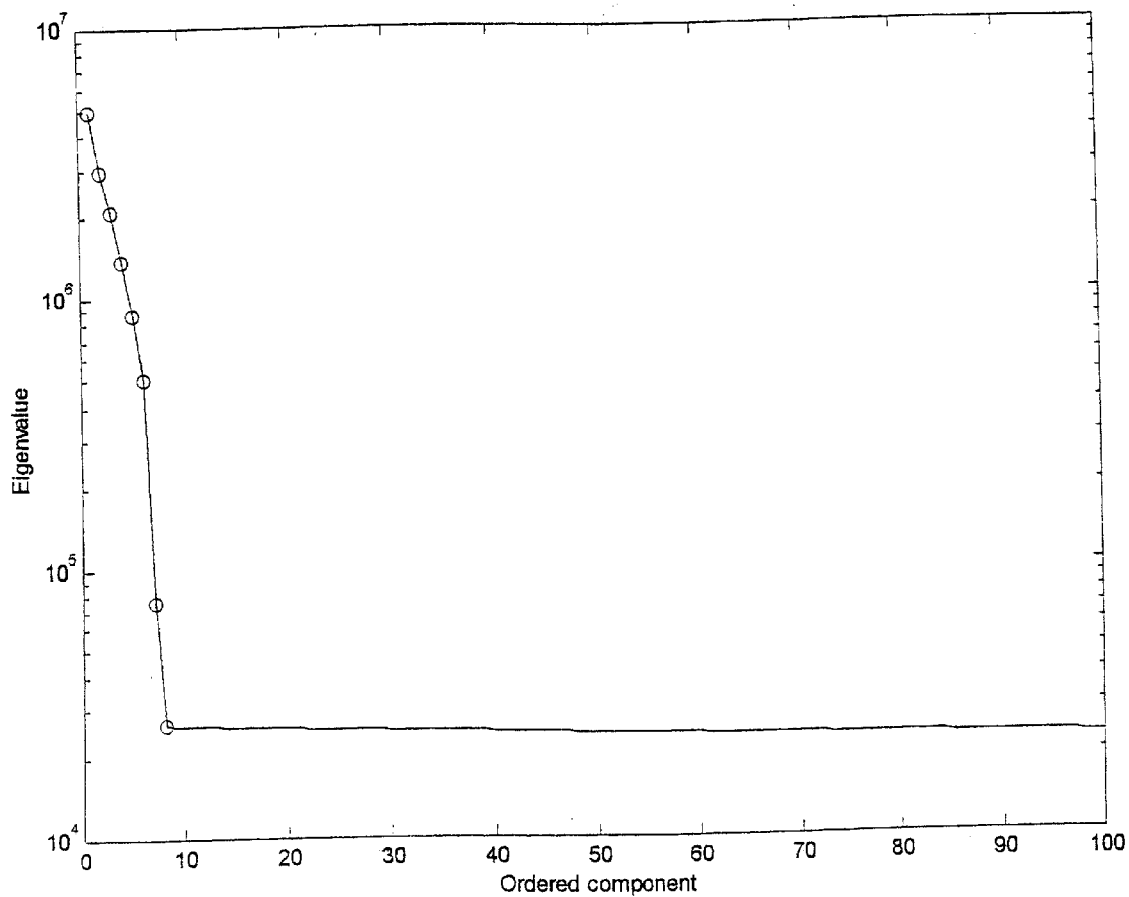
FIG. 15 shows the results of an eigenvalue analysis of the cross product matrix $D^T D$, according to an embodiment of the present invention.

FIG. 15 shows an example of the results of an eigenvalue analysis of the cross product matrix $D^TD$, according to an embodiment of the present invention. FIG. 15 plots the magnitude of the eigenvalues E for the first one hundred eigenvalues for a spectrum image similar to that shown in FIG. 4. Clearly, there is an abrupt change in both the magnitude and slope at the point where the spectral vectors become non-significant. Therefore, we can identify by inspection the seven most statistically significant chemical components, corresponding to the seven circled eigenvalues in FIG. 15.

Figure 16:
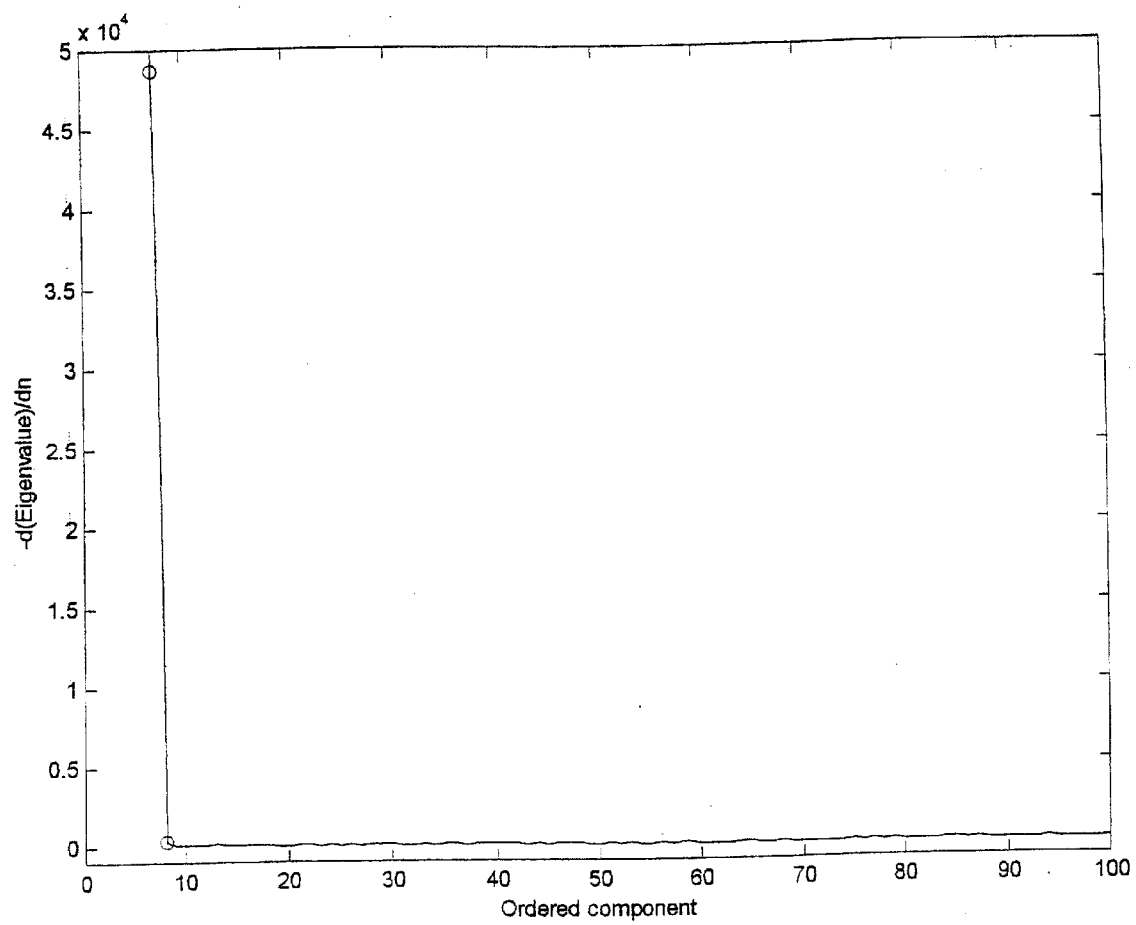
FIG. 16 shows the results of taking the negative derivative of the curve previously shown in FIG. 15, according to an embodiment of the present invention.

Next, one can take the negative derivative of the curve in FIG. 15 (with respect to the ordered component number, n). This is shown in FIG. 16. In FIG. 16 an abrupt transition is observed in the negative derivative, but, now, the insignificant eigenvalues fall on a line that is nearly equal to zero and which is approximately flat.

The method of step 30 assumes that no more than twenty-five significant components are present (although a limit other than twenty-five could be easily chosen. A line is then fitted through $-d(\Sigma^2)/dn$ for n=26 to 100. Working backwards from n=26, $-d(\Sigma^2)/dn$ is extrapolated and the least significant component that will be retained in the analysis corresponds to the first component (while ascending) that exceeds the extrapolated prediction by a specified margin. We define this margin as the "sensitivity threshold". The sensitivity threshold can be calculated by multiplying a "sensitivity constant" times the standard deviation of the prediction residuals of best-fit line fitted for a selected set of components, for example, n=26 to 100. A useful value for the sensitivity constant equals twenty-five. In general, we have found that the algorithm for selecting the proper number of pure spectral components in step 30 appears to err on the side of retaining too many components (which is conservative).

In summary, the algorithm for automatically selecting the number of chemically relevant species in step 30 comprises arranging the eigenvalues in descending order, and then taking a numerical derivative with respect to the ordered eigenvalue number, n. A line is then fit to a portion of this curve over which the eigenvalues are known to describe noise. The least significant spectral component retained in the analysis corresponds to the first eigenvalue encountered (while ascending) that exceeds the value predicted by the fitted line by a specified margin. The margin can be, for example, twenty-five times the standard deviation of the fitted prediction residuals for the best-fit line.

Alternatively, the automated selection method of step 30 can comprise using a Scree-plot, or a Malinowski F-test, to determine the proper number of pure spectral components. Both of these methods are described on pp. 142–144 in *Handbook of Chemometrics and Qualimetrics: Part B*, by B. G. M. Vandeginste, et al., Data Handling in Science and Technology, Vol. 20B, published by Elsevier Press, Amsterdam, The Netherlands (1998), which is herein incorporated by reference.

We have picked the particular sensitivity threshold.(i.e., twenty-five times the standard deviation of the prediction residuals) that gives good sensitivity under the S/N conditions that are normally encountered, and tends to err on the side of retaining too many components. However, there are recent cases where the analysts (while only interested in the gross composition of their samples) collected data with a very high S/N and subsequently were confused by the large number of components that were automatically identified by this method. While the automated answer was correct in the sense that all of the detected phases were real, the automated answer obscured the simple answer that the analysts were looking for.

To solve this particular problem, the User can provide input to the process for selecting q. A Graphical User Interface (GUI) interface can be used to provide an adjustable control (e.g., slider bar) that adjusts the overall sensitivity of the automated process for selecting q. Thus, if the analyst were interested in analyzing only a few major constituents in the sample, he/she could direct the program to use a low sensitivity setting when automatically detecting them. The adjustable GUI control (e.g., slider bar) could control the numerical value of the sensitivity constant used to compare the size of an eigenvalue with its prediction residual. The current example of the code uses a fixed value of twenty-five. However, the slider bar could be configured to select a number from the range consisting of, for example, 1 to 100.

An alternative approach for selecting the sensitivity can be used. This can comprise computing the largest residual that corresponds to the largest eigenvalue, and then scaling the actual sensitivity threshold to equal a percentage of this largest residual by allowing the sensitivity constant to vary between 0 and 1. Thus, the slider control would run from 0% (most sensitive and would give all of the eigenvectors, including the noisy ones) to 100% (least sensitive and only give the single largest component), or alternatively, with 0% being the least sensitive and 100% being the most sensitive.

Note that the number components q selected at a given intermediate sensitivity setting will still depend on the particular data set.

Alternatively, the User can direct the program, for example, via a GUI, to compute a predetermined or fixed number of components. That number will be computed independent of the particulars of the data set. This latter option would be useful, for instance, in the case where we are studying the interdiffusion of two metals, but are not interested in any impurities that might be present in the metals. In this example, the User could fix the analysis to compute only these two components to get directly at the information we are interested in.

By performing a full eigenvalue decomposition, we can get two pieces of information, namely, the eigenvalues E, which relate to the appropriate number of pure components q to include in the analysis, and the eigenvectors V, which can provide an initial estimate of S. Alternatively, the eigenvalues can be computed without computing the eigenvectors. Thus, the eigenvalues can be used to select q independently of what method is used to obtain an initial estimate of S. There can be a computational advantage to computing only E (and not the eigenvectors V), while estimating S by other means. For example, using built-in MATLAB® routines after computing the crossproduct matrix for the 128×128×1024 dataset that has been discussed before, computing E alone required 11 seconds on a Pentium-III machine, whereas computing both E and V required 68 seconds.

Step 32 in FIG. 10: Performing an Orthogonal VARIMAX Rotation

A single principal component will not, in general, represent either a pure element or a multi-element phase, but rather, a linear combination of such elements or phases. In other words, there may not be a one-to-one correspondence between a selected principal component and a particular chemical phase or pure element.

While the eigenvectors V include all of the information contained in the pure spectral components, they do not do so in a chemically recognizable form. For example, physically admissible concentrations must be non-negative, and the pure spectral components must be greater than the background signal, whereas a general principal components analysis is not thus constrained. The principal components produced by PCA often have negative values, which presents a spectrum that is difficult for the practicing analyst to understand. Additionally, a major disadvantage of PCA is that the principal components are constrained to be orthogonal, while any chemical phase that contains overlapping spectral peaks will necessarily be non-orthogonal. Therefore, subsequent post-processing of results obtained from PCA is useful for deconvolving the abstract components into physically meaningful results.

After selecting the proper number of pure spectral components, q, in step 30, and after compressing V to have rank=q in step 31, a general eigenvector transformation can be performed on the corresponding reduced set of spectral components S. This general eigenvector transformation can be an orthogonal VARIMAX rotation, for example. The VARIMAX transform is described in detail on pp. 254–256 (Vandeginste, Ibid.), and in *Modern Factor Analysis* by H. H. Harman, Univ. of Chicago Press, Chicago, Ill., (1976), pp. 290–292, which is herein incorporated by reference. The purpose of the general eigenvector transformation is to transform the abstract loading vectors into the space of more physically realizable spectra. VARIMAX rotation is a vector rotation that maximizes the total variance of the squared vectors, while keeping all vectors orthogonal to each other. After VARIMAX rotation is completed, the sign is selected so that the rotated vectors are predominantly positive. Then, all negative values are set to zero. The non-negativity adjusted VARIMAX-rotated vectors S can be used in step 34 as a good starting point (i.e., initial guess) for beginning the Alternating Least Squares (ALS) solution process.

VARIMAX is not the only type of general eigenvector transformation that can be performed. Alternatively, other types of orthogonal rotations can be used, such as QUARTIMAX and ORTHOMAX. Alternatively, other types of non-orthogonal rotations can be used, such as OBLIMAX and PROMAX. These alternate methods are discussed in the references cited above (i.e., Vandeginste, and Harman).

Steps 36, 38, 39, 41, 43: Adjusting for the Estimated Spectral Background in FIG. 10

The method illustrated in FIG. 10 robustly corrects for large spectral backgrounds by constraining all of the spectral features to be equal to or greater than the background. That is, the least squares minimization problem we want to solve is:

$$min\|D-C\ S\|^2 \qquad (21)$$

subject to S≧B, where B is the non-specific background matrix. In actuality, we can solve the problem min ||D−C S ||² subject to S≧B, directly by using an active constraint approach similar to that taken by NNLS. We simply need to modify the non-negativity constrained routine NNLS to replace the variable values corresponding to the active constraints with the magnitudes of the estimated background, rather than replacing the variable values with zero. We can then re-estimate the background, perform a new background-constrained estimate of the pure spectra, and repeat these steps as many times as needed until an acceptable result is achieved.

The background-constrained, iterative least squares approach used in the method of FIG. 10 provides an answer more quickly than the method of FIG. 9, since background concentrations aren't computed. In the method of FIG. 9, given the fitted pure spectral vectors+background, the background is estimated, its estimated contribution removed from the data set and new, presumably background-free estimates of the pure spectral vectors are computed by using non-negativity constrained least squares.

Alternatively, in the method of FIG. 10, the background is also estimated, but then used as a lower bound constraint to obtain a new estimate of the pure spectral vectors+ background. We can then subtract the background to get the pure spectral vectors. The original data matrix D is not changed during this method. This saves computational time, since D is the largest matrix we are dealing with and since we can use the algorithm in an iterative mode in cases with a very pronounced background. That is, since we use an initial estimate of pure spectral vector plus background to compute a better estimate of the same thing, we can iterate until we converge to the best estimate, in a least squares sense.

Experimental Results

Figure 18:
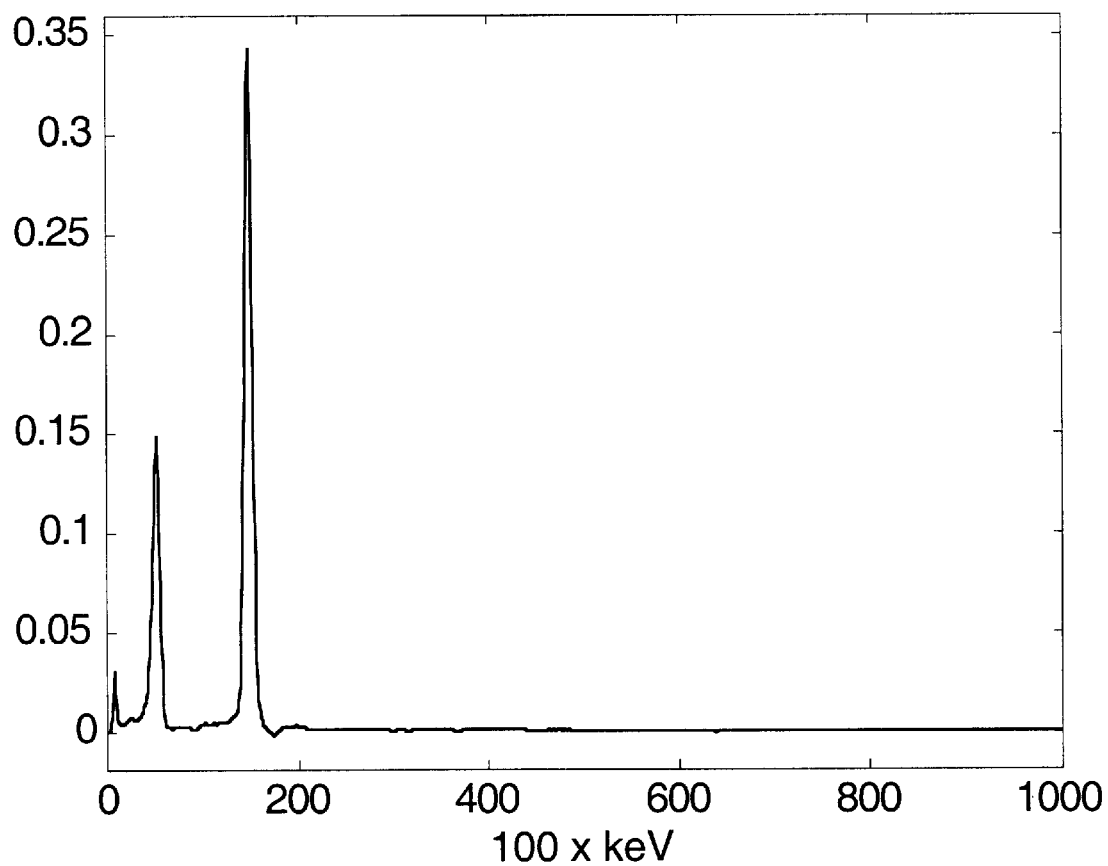
FIG. 18 illustrates the resultant spectrum of the alumina phase, according to an embodiment of the present invention.
Figure 19:
FIG. 19 illustrates the corresponding resultant 2-D spatial distribution of the concentration of the alumina phase, according to an embodiment of the present invention.
Figure 20:
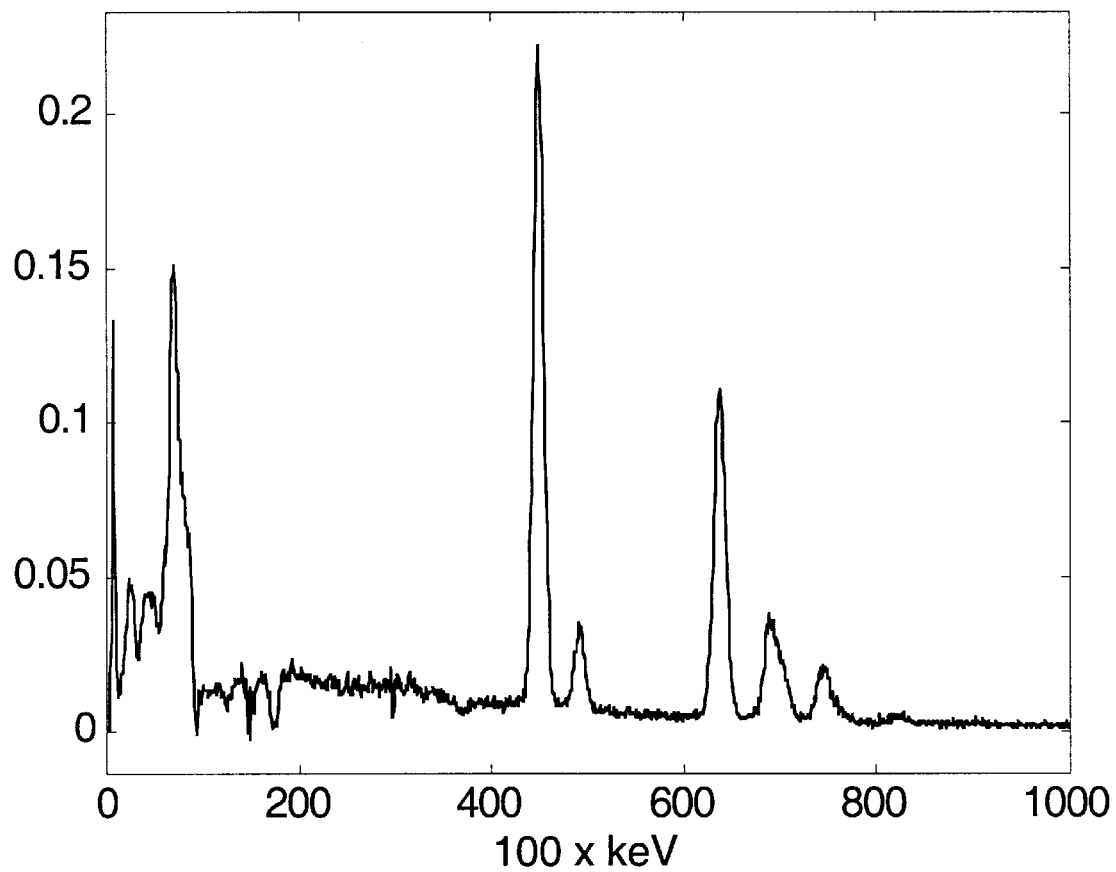
FIG. 20 illustrates the resultant spectrum of the interface phase (Ti, Fe, Ni, and Co), according to an embodiment of the present invention.
Figure 21:
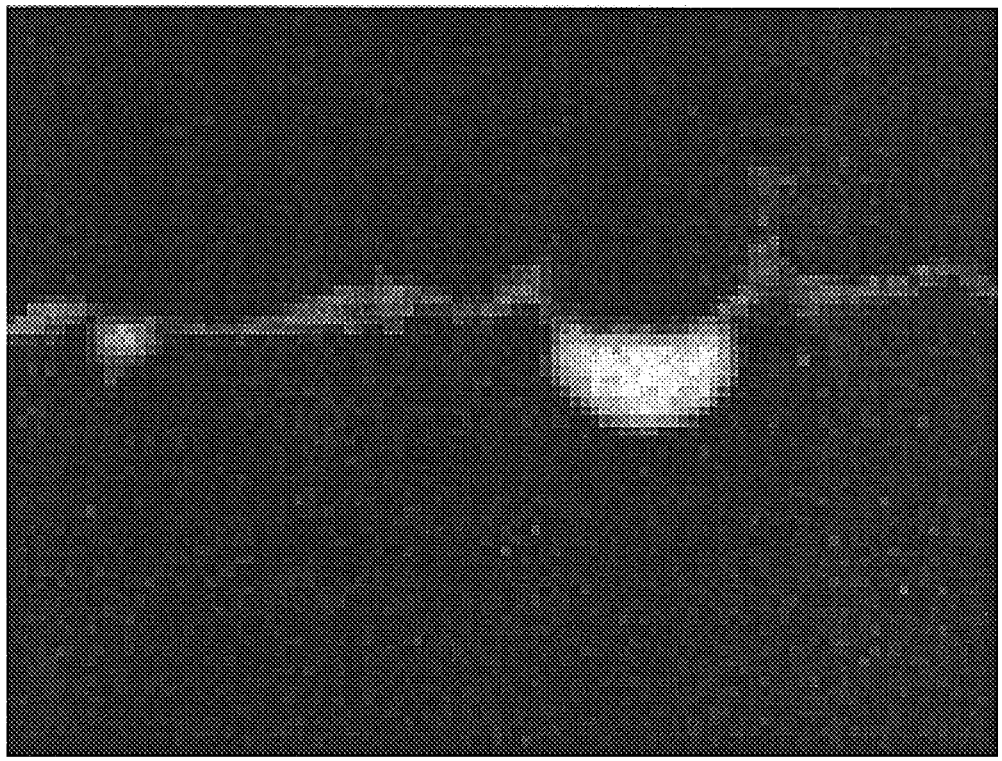
FIG. 21 illustrates the corresponding resultant 2-D spatial distribution of the concentration of the interface phase (Ti, Fe, Ni, and Co), according to an embodiment of the present invention.

Examples of converged final results are shown in FIGS. 18, 19, 20, and 21, which were obtained after performing fifty iterations of the ALS procedure. FIG. 18 illustrates the resultant spectrum of the alumina phase, according to an embodiment of the present invention. FIG. 19 illustrates the corresponding resultant 2-D spatial distribution of the concentration intensity of the alumina phase, according to an embodiment of the present invention. FIG. 20 illustrates the resultant spectrum of the interface phase (Ti, Fe, Ni, and Co), according to an embodiment of the present invention. FIG. 21 illustrates the corresponding resultant 2-D spatial distribution of the concentration intensity of the interface phase (Ti, Fe, Ni, and Co), according to an embodiment of the present invention.

Given the simplicity of the constraints employed, the results are excellent. This example demonstrates that chemical phases and compositional gradients can be accurately separated and displayed. The pure spectra are of sufficiently high quality that the elements/phases should be readily identifiable through the application of well-known standard library searches (e.g., AutoID or Desktop Spectrum Analyzer, DTSA, freely available from NIST). The combined PCA+ALS analysis also did a very good job of isolating the minor phases present in the sample. Well-defined pure spectra are obtained for the glass and interface phases, whereas the corresponding spectral features are barely visible in the average spectrum shown in FIG. 4.

The above implementation was tested on seven two-dimensional spectrum images, all 128×128×1024, obtained by X-ray energy dispersive spectroscopy in an SEM. The number of automatically identified pure components, q, ranged from 4 to 8, for these examples. Good results were achieved with computation times that were typically less than ten minutes on a moderately powerful PC. The method was also very successful in separating closely spaced, overlapping spectral peaks, although this generally used somewhat longer computational times. It is worth noting that in these cases (i.e., overlapping peaks), the convergence criterion can be relaxed to speed up computation time, without loosing too much accuracy.

In the most recent version of MATLAB® (Ver. 6.0) substantial improvements were made in MATLAB's own built-in SVD routine. Nevertheless, it is still slower compared to what the present invention. Table 2 compares the results of using the present code to results using MATLAB's own built-in SVD and EVD routines. All of these results were obtained on a Dell Precision 620, running dual Pentium III processors at 933 MHz. The image data set is same 128×128×1024 as discussed earlier. Note that MATLAB® routines use only a single processor. The present code can use one or two processors, so the comparisons are fair and would apply equally well to a single processor machine. However, since the present code will automatically use dual processors (if present) without recompiling, we have included results using both processors to show that we can get additional speed-up if we use multiple processors.

Table 2: Comparison of Timing Results

MATLAB® SVD: 635 seconds
The present code SVD: 225 seconds (145 seconds with dual processors)
MATLAB® EVD: 589 seconds
The present code EVD: 52 seconds (31 seconds with dual processors)

We observe that the present code performs at least ten times better than we could do using the most recent version of MATLAB's (V 6.0) own built-in EVD or SVD routines.

The routines used in the present code are much more memory-efficient. For example, using MATLAB's own built-in EVD needs RAM memory equal to about double the size of the image matrix (e.g., 271 MB for the image above, which is 131 MB in size). In comparison, only 157 MB was needed to do the same computation using the present code. The present code minimizes memory requirements, which can permit the present invention to run on desktop PC's because 512 MB to 1000 MB is the maximum amount of memory that can typically be purchased, even for a high end PC.

The particular examples discussed above are cited to illustrate particular embodiments of the invention. Other applications and embodiments of the apparatus and method of the present invention will become evident to those skilled in the art. For example, the method of the present invention can be implemented in an computational architecture suitable for scalable operation on a wide variety of parallel processing machines, from multiprocessor workstations to large distributed memory machines. In particular, the PCA and ALS algorithms described earlier can be implemented to run using parallel computational routines. Detailed discussion of a parallel multivariate spectral analysis program can be found in "Multivariate Image Analysis Tools for Chemical Characterization", by M. R. Keenan, The University of New Mexico, Albuquerque High Performance Computing Center, Technical Report #AHPCC99-011 (1999), which is herein incorporated by reference. Numerical experiments showed good scalability and speed-up over a reasonable range of machine sizes. For example, computational time on sixteen parallel processor nodes of an IBM SP2 was a couple of minutes, compared to about a half an hour for a MATLAB® implementation on a fast PC using a single processor.

The method of the present invention has been successfully used to determine the properties of a sample where the measured spectral data was generated using the SIMS technique (Secondary Ion Mass Spectroscopy).

The actual scope of the invention is defined by the claims appended hereto.

We claim:

1. A method of determining the properties of a sample from measured spectral data collected from the sample; comprising:
    a) providing a two-dimensional matrix A containing measured spectral data;
    b) generating a weighted spectral data matrix D by weighting matrix A;
    c) factoring D into the product of two matrices, C and $S^T$, by performing a constrained alternating least-squares analysis of $D=CS^T$, where C is a concentration intensity matrix and S is a spectral shapes matrix;
    d) unweighting C and S by applying the inverse of the weighting used in step b); and
    e) determining the properties of the sample by inspecting C and S.

2. The method of claim 1, wherein the measured spectral data varies with time.

3. The method of claim 1, wherein step c) further comprises constraining $C \geq 0$ and $S \geq 0$.

4. The method of claim 1, comprising constraining C during the alternating least-squares analysis of $D=CS^T$ to track a physical attribute.

5. The method of claim 1, comprising constraining S during the alternating least-squares analysis of $D=CS^T$ to track a physical attribute.

6. The method of claim 1, comprising constraining S during the alternating least-squares analysis of $D=CS^T$ to track a specified spectral shape.

7. The method of claim 1, comprising constraining S during the alternating least-squares analysis of $D=CS^T$ to track a specified number of spectral peaks.

8. The method of claim 1, wherein step a) further comprises providing, and then unfolding, a three-dimensional measured spectral data array X into the two-dimensional matrix of measured spectral data A.

9. The method of claim 1, wherein the weighting of matrix A comprises removing data outliers from matrix A by assigning a sufficiently small weight to the corresponding element of a weighting matrix.

10. The method of claim 9, wherein the data outlier comprises a malfunctioning energy channel.

11. The method of claim 9, wherein the data outlier comprises a malfunctioning pixel.

12. The method of claim 1, wherein the weighting of matrix A comprises performing a weighting operation based on Poisson statistics.

13. The method of claim 12, wherein generating the weighted data matrix D comprises post-multiplying A by a weighting matrix H, wherein the diagonal elements of H are equal to the inverse square root of the corresponding elements of a mean spectrum vector of A, wherein the mean spectrum vector of A has been generated by averaging the spectra obtained from each pixel over all of the pixels.

14. The method of claim 12 wherein generating the weighted data matrix D comprises weighting A by the inverse square root of a mean image, comprising: pre-multiplying A by a diagonal weighting matrix G, whose diagonal is obtained by averaging the rows of D, and then inverting and taking the square root.

15. The method of claim 1, wherein generating the weighted data matrix D comprises post-multiplying A by a weighting matrix H, where H represents the inverse square root of an estimated noise covariance matrix K, according to $K^{-1}=HH^T$.

16. The method of claim 15, wherein H is given by $H=JM^{-\frac{1}{2}}$, where J is a matrix of eigenvectors and M is a diagonal matrix containing eigenvalues, and further wherein J and M are determined by performing an eigen value decomposition of the estimated noise covariance matrix K, according to $K=JMJ^T$.

17. The method of claim 16, further comprising generating the estimated noise covariance matrix K according to $K=N^TN/N_{pixels}$, where $N_{pixels}$ equals the total number of pixels in a 2-D image, and where N is a fully populated matrix of the same dimensions as D, and where N contains estimates of the standard deviations of the measured spectral data for each energy channel at each pixel.

18. The method of claim 17, further comprising estimating N from multiple, replicate observations of the measured spectral data.

19. The method of claim 17, further comprising estimating N from a shift-difference image.

20. The method of claim 17, further comprising estimating N from the output of a laplacian of a Gaussian filter applied to an image.

21. The method of claim 17, further comprising estimating N from a wavelet decomposition of the 2-D image.

22. The method of claim 15, further comprising performing a Cholesky factorization of $K^{-1}$.

23. The method of claim 13, wherein unweighting the converged matrix S in step d) of claim 1 comprises element-wise multiplication of each converged spectral vector in S by the square root of the corresponding elements of the mean spectrum vector of A.

24. The method of claim 14, wherein unweighting the converged matrix C in step d) comprises element-wise multiplication of each converged column in C by the square root of the corresponding elements of the mean image of A.

25. The method of claim 1, further comprising determining the spatial distribution of the concentration intensity of a specific chemical species selected from the converged concentration intensity matrix C.

26. The method of claim 1, further comprising performing and applying a calibration to convert the concentration intensity of a specific chemical species selected from the converged concentration intensity matrix C into a real chemical concentration.

27. The method of claim 1, further comprising displaying the spectrum of a specific chemical species selected from the converged matrices C and S.

28. The method of claim 1, wherein the measured spectral data comprises at least one X-ray energy spectrum.

29. The method of claim 28, wherein the X-ray energy spectrum was generated in response to irradiating the sample with a beam of energetic electrons.

30. The method of claim 1, further comprising receiving measured spectral data from an energy dispersive spectrometer system.

31. The method of claim 1, further comprising receiving measured spectral data from a pulse height analyzer.

32. The method of claim 1, further comprising performing a singular value decomposition of D, according to $D=U\Sigma V^T$, where S=V, and $C=U\Sigma$.

33. The method of claim 32, wherein the singular value decomposition of D is performed using processor-optimized linear algebra routines.

34. The method of claim 33, further comprising using the LAPACK routine "DGESDD" to compute the singular value decomposition of D.

35. The method of claim 1, further comprising performing an eigen value decomposition of the cross product matrix $D^TD$, according to $D^TD=V\Sigma^2V^T$, thereby obtaining full-rank eigenvectors V and eigenvalues E; and then setting S=V, and $C=DS\,(S_TS)^{-1}$.

36. The method of claim 35, wherein the formation of the cross product matrix $D^TD$, and the eigen value decomposition of $D^TD$, are performed using processor-optimized linear algebra routines.

37. The method of claim 36, further comprising using the BLAS routine "DSYRK" or "DGEMM" to compute the cross product matrix $D^TD$.

38. The method of claim 37, further comprising using BLAS routines from the Intel Math Kernel Library.

39. The method of claim 36, further comprising using the LAPACK routine "DSYEVD" or "DSYEV" to compute the eigen value decomposition of $D^TD$.

40. The method of claim 1, wherein an initial estimate for S is generated by performing an Orthogonal Projection Approach.

41. The method of claim 1, further comprising computing only the eigenvalues of $D^TD$, and not computing the eigenvectors, then using the computed eigenvalues to select the proper number of pure components q, independent of what method is used to generate an initial estimate for S.

42. The method of claim 1, further comprising generating an initial estimate for S by generating a series of positive random numbers.

43. The method of claim 1, further comprising generating an initial estimate for S by selecting a spectrum for a suspected element or phase from a lookup table of known spectra.

44. The method of claim 35, further comprising selecting the proper number of pure components q, after obtaining the full-rank eigenvectors V and eigenvalues E.

45. The method of claim 35, wherein the proper number of pure components q, is pre-selected and fixed prior to factoring D.

46. The method of claim 35, wherein the proper number of pure components q, is automatically selected using a Scree-plot or using a Malinowski F-test.

47. The method of claim 44, wherein automatically selecting the proper number of pure components q comprises:
  a) arranging the eigenvalues E in descending order;
  b) taking a numerical derivative of E with respect to the eigenvalue number, n, and plotting-dE/dn versus n to create a curve;
  c) fitting a line to a portion of this curve over which the eigenvalues are known to describe noise;
  d) identifying the first eigenvalue encountered while ascending that exceeds the value predicted by the fitted line by a specified margin; and
  e) setting q to be equal to the eigenvalue number n of the first eigenvalue encountered in step d).

48. The method of claim 47, wherein the set of eigenvalues that are known to describe noise in step c) is equal to the set of eigenvalues whose eigenvalue numbers n are greater than twenty-five, and are less than or equal to 100.

49. The method of claim 48, wherein the specified margin in step d) is equal to a sensitivity constant times the standard deviation of the prediction residuals of the best-fit line fitted to the set of eigenvalues whose eigenvalue numbers n are greater than twenty-five.

50. The method of claim 49, wherein the sensitivity constant equals twenty-five.

51. The method of claim 44, wherein an initial estimate for S is generated by compressing the dimensions of S to have a rank=q, after selecting the proper number of pure components q.

52. The method of claim 51, further comprising, after compressing the dimensions of S to have a rank=q, the steps of:
  a) performing a general eigenvector transformation on the compressed eigenvector matrix S;
  b) selecting the sign of the transformed eigenvectors so that they are predominantly positive; and
  c) setting all negative values of the transformed eigenvectors to zero.

53. The method of claim 51, wherein performing the general eigenvector transformation comprises performing an orthogonal rotation selected from the group consisting of VARIMAX, QUARTIMAX, and ORTHOMAX orthogonal rotations.

54. The method of claim 51, wherein performing the general eigenvector transformation comprises performing an non-orthogonal rotation selected from the group consisting of OBLIMAX and PROMAX non-orthogonal rotations.

55. The method of claim 53, further comprising using VARIMAX rotated eigenvectors as an initial estimate for S.

56. The method of claim 1, further comprising preserving active constraint sets upon successive alternating least-squares iterations to enhance convergence speed by providing better iteration starting points.

57. The method of claim 1, further comprising using the BLAS routine "DGEMM" or "DSYRK", to compute large matrix crossproducts.

58. The method of claim 57, further comprising using BLAS routines from the Intel Math Kernel Library.

59. The method of claim 1, further comprising applying a convergence criterion based on the sum of the squared differences of S between successive ALS iterations, including computing the criterion separately for each of the columns of S.

60. The method of claim 59, further comprising removing individual converged components from S during subsequent ALS iterations.

61. The method of claim 1, further comprising identifying the prominent spectral peaks of a selected chemical species from the converged matrices C and S by comparing the prominent spectral peaks with known spectrum signatures of known elements, phases, or alloys.

62. The method of claim 1, implemented in a parallel-processing computational architecture.

63. The method of claim 1, further comprising generating an initial estimate for the matrix C, prior to factoring D.

64. The method of claim 63, further comprising weighting the rows of D, followed by performing the corresponding unweighting of the converged results for C by multiplying each column of C element-wise by the square root of a mean image.

65. A method of determining the properties of a sample from measured spectral data collected from the sample; comprising:
  a) providing a two-dimensional matrix of measured spectral data A;
  b) generating a weighted spectral data matrix D by weighting matrix A;
  c) generating an initial estimate for a spectral shapes matrix S;
  d) using the initial estimate for S, factoring D into the product of two matrices C and $S^T$, by performing a non-negativity constrained alternating least-squares analysis of $D=CS^T$, where C is a concentration intensity matrix;
  e) unweighting the matrix S generated in step d) by applying the inverse of the weighting used in step b);
  f) estimating the spectral background B;
  g) calculating P=S−B and $S_B$=B, and redefine S=[P $S_B$], where P is a matrix of pure spectral components without background;
  h) reweighting S and B, using the same weighting that was used in step b);
  i) solving $D=[C_P\ C_B]\cdot[P\ S_B]^T$ by performing alternating least squares analysis, subject to $C_P$, $C_B$, $P \geq 0$ and $S_B$=B;
  j) repeating steps e) through i) until acceptable convergence is achieved;
  k) unweighting $C_P$ and S by applying the inverse of the weighting used in step b);
  l) reformatting the columns of $C_P$ as a two-dimensional image; and
  m) determining the properties of the sample by inspecting $C_P$ and P;
wherein $S_B$ is the background spectral shapes matrix, $C_P$ is the concentration intensity matrix without background, and $C_B$ is the background concentration intensity matrix.

66. The method of claim 65, wherein estimating the spectral background B comprises fitting the background by using a robust statistical technique.

67. The method of claim 66, wherein the robust statistical technique comprises using a method of linear regression selected from the group consisting of least median of squares or least trimmed squares.

68. The method of claim 65, wherein estimating a spectral background comprises:
  a) selecting a pure component;
  b) identifying at least one major element that comprise the selected pure component by inspecting S;
  c) applying an automated analysis program to generate a physically accurate background shape for the particular combination of elements or element identified in step b); and d) fitting the background shape generated in from step b) to the pure component spectrum of the selected pure component.

69. The method of claim 68, wherein the automated analysis program used in step c) comprises the Desktop Spectrum Analyzer program (DTSA).

70. The method of claim 65, wherein the spectral background is estimated using linear combinations of shapes based on a physical model.

71. The method of claim 70, wherein the physical model is given by:

$$I = z \frac{(E_0 + E)}{E} \exp(-z^4 / E^3)$$

wherein I=background intensity, Z=atomic number, $E_0$=primary beam energy, and E=variable photon energy.

72. The method of claim 65, wherein estimating the spectral background B comprises executing a fitting algorithm, wherein the algorithm comprises:
   a) selecting a number of points, r, where $r \geq p/2+1$, and where p is the total number of energy channels;
   b) performing non-negativity constrained least squares analysis to fit to the background shapes;
   c) selecting the number of points, r, having the smallest residuals; and
   d) if the set from step c) is the same set of points as we fit in step b), then stop, otherwise go back to step b) and repeat steps b), c) and d).

73. The method of claim 72, wherein r=p−s, where s equals the number of channels corresponding to the spectral peaks in a spectrum.

74. The method of claim 72 wherein r=p/2+1.

75. The method of claim 72, wherein the $r^{th}$ point of a spectrum is assumed to lie on the background.

76. The method of claim 72, further comprising selecting the r points about the median point of a spectrum, to provide a better starting point than using a random selection.

77. The method of claim 72, wherein the channels selected for fitting are partially constrained to ensure relatively uniform coverage over the entire energy range.

78. The method of claim 72, wherein half of the points are selected from each of the low-energy and the high-energy halves of the spectrum, to assure a relatively uniform distribution of points.

79. The method of claim 65, further comprising refolding $C_P$ and P into a three-dimensional data array, after step j).

80. A method of determining the properties of a sample from measured spectral data collected from the sample; comprising
   a) providing, and then unfolding, a three-dimensional spectral data array X to form a two-dimensional matrix of measured spectral data A;
   b) generating a weighted spectral data matrix D by weighting matrix A, using Poisson statistics;
   c) generating an initial estimate for a spectral shapes matrix S by obtaining eigenvectors V of the cross product matrix $D^T D$; automatically selecting the proper number of pure components q; compressing V to have rank=q; and performing a VARIMAX rotation on the reduced matrix V to produce the initial estimate for S;
   d) using the initial estimate for S, factoring D into the product of two matrices C and $S^T$, by performing a non-negativity constrained alternating least-squares analysis of $D=CS^T$, where C is a concentration intensity matrix;
   e) unweighting S by applying the inverse of the weighting used in step b);
   f) estimating the spectral background B;
   g) reweighting S and B, using the same weighting that was used in step b);
   h) solving $D=CS^T$ for C and S by performing an alternating least-squares analysis subject to the constraints $C \geq 0$ and $S \geq B$;
   i) repeating steps e) through i) until acceptable convergence is achieved;
   j) unweighting C and S by applying the inverse of the weighting used in step b);
   k) calculating P=S−B, where P is a matrix of pure spectral components without background;
   l) reformatting the columns of C as a two-dimensional image; and
   m) determining the properties of the sample by inspecting C and P.

81. The method of claim 80 further comprising using processor-optimized linear algebra routines.

82. A computer readable medium having thereon instructions for causing a computer to perform the method of claim 1.

83. A method of determining the properties of a sample from measured spectral data collected from the sample; comprising
   a) providing, and then unfolding, a three-dimensional spectral data array X to form a two-dimensional matrix of measured spectral data A;
   b) generating an initial estimate for a spectral shapes matrix S by obtaining eigenvectors V of the cross product matrix $A^T A$; automatically selecting the proper number of pure components q; compressing V to have rank=q; and performing a VARIMAX rotation on the reduced V to produce the initial estimate for S;
   c) using the initial estimate for S, factoring A into the product of two matrices C and $S^T$, by performing a non-negativity constrained alternating least-squares analysis of $A=CS^T$, where C is a concentration intensity matrix;
   d) estimating the spectral background B using a robust least squares statistical method based on a linear combination of shapes based on a physical model;
   e) solving $A=CS^T$ for C and S by performing an alternating least-squares analysis subject to the constraints $C \geq 0$ and $S \geq B$;
   f) repeating steps d) through f) until acceptable convergence is achieved;
   g) subtracting B from S to generate a matrix P of pure spectral components without background;
   h) reformatting the columns of C as a two-dimensional image; and determining the properties of the sample by inspecting C and P.

84. A method of determining the properties of a sample, comprising:
   a) detecting radiation emitted by the sample;
   b) generating measured spectral data by processing the detected radiation;
   c) performing a multivariate spectral analysis of the measured spectral data, comprising:
      i) providing a two-dimensional matrix A containing the measured spectral data;
      ii) generating a weighted spectral data matrix D by weighting matrix A;

iii) factoring D into the product of two matrices C and $S^T$, by performing a constrained alternating least-squares analysis of $D=CS^T$, where C is a concentration intensity matrix and S is a spectral shapes matrix;

iv) unweighting C and S by applying the inverse of the weighting used in step ii); and d) determining the properties of the sample by inspecting C and S.

85. The method of claim 84, further comprising stimulating the sample to emit radiation.

86. The method of claim 84, further comprising irradiating the sample with parallel beam of irradiation.

87. The method of claim 85, further comprising irradiating the sample with X-rays to stimulate the emission of X-rays.

88. The method of claim 87, further comprising performing X-ray Fluorescence (XRF).

89. The method of claim 85, further comprising irradiating the sample with electrons to stimulate the emission of electrons.

90. The method of claim 89, further comprising performing Electron Energy-Loss Spectrometry (EELS).

91. The method of claim 90, further comprising performing Electron Spectroscopic Imaging (ESI).

92. The method of claim 90, further comprising performing Energy Filtered Imaging (EFI).

93. The method of claim 89, further comprising performing Auger Emission Spectrometry (AES).

94. The method of claim 85, further comprising irradiating the sample with ions to stimulate the emission of ions.

95. The method of claim 94, further comprising performing Secondary-Ion Mass Spectrometry (SIMS).

96. The method of claim 85, further comprising irradiating the sample with ions to stimulate the emission of X-rays.

97. The method of claim 96, further comprising performing Particle Induced X-ray Emission (PIXE).

98. The method of claim 85, further comprising irradiating the sample with particles to stimulate the emission of gamma rays.

99. The method of claim 85, further comprising irradiating the sample with X-rays to stimulate the emission of electrons.

100. The method of claim 99, further comprising performing X-ray Photoelectron Spectroscopy (XPS).

101. The method of claim 85, further comprising irradiating the sample with electrons to stimulate the emission of X-rays.

102. The method of claim 101, further comprising performing Electron Probe Micro Analysis (EMPA), Scanning Electron Microscopy (SEM) with attached Energy Dispersive Spectrometer (EDS), or X-ray Microanalysis (XMA).

103. The method of claim 85, further comprising irradiating the sample with sunlight to stimulate the emission of photons.

104. The method of claim 103, further comprising performing IR Reflectometry.

105. The method of claim 85, further comprising performing Raman Spectroscopy.

106. The method of claim 84, wherein the measured spectral data comprises the intensity, energy, and spatial location of detected X-rays.

* * * * *